US009691465B2

(12) United States Patent
Nemati et al.

(10) Patent No.: US 9,691,465 B2
(45) Date of Patent: Jun. 27, 2017

(54) THYRISTORS, METHODS OF PROGRAMMING THYRISTORS, AND METHODS OF FORMING THYRISTORS

(71) Applicant: Micron Technology, Inc., Boise, ID (US)

(72) Inventors: Farid Nemati, Redwood City, CA (US); Scott T. Robins, San Jose, CA (US); Rajesh N. Gupta, Karnataka (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/948,097

(22) Filed: Nov. 20, 2015

(65) Prior Publication Data
US 2016/0078917 A1    Mar. 17, 2016

Related U.S. Application Data

(60) Continuation of application No. 13/957,304, filed on Aug. 1, 2013, now Pat. No. 9,361,966, which is a
(Continued)

(51) Int. Cl.
*H01L 21/28*    (2006.01)
*G11C 11/39*    (2006.01)
(Continued)

(52) U.S. Cl.
CPC ........ *G11C 11/39* (2013.01); *H01L 21/28008* (2013.01); *H01L 27/0817* (2013.01);
(Continued)

(58) Field of Classification Search
CPC ............ H01L 21/28008; H01L 29/749; H01L 29/083; H01L 27/1027; H01L 21/30604;
(Continued)

(56) References Cited

U.S. PATENT DOCUMENTS 3,988,771 A    10/1976 Krishna
4,487,639 A    12/1984 Lam et al.
(Continued)

FOREIGN PATENT DOCUMENTS

CN    101405849    8/2009
CN    101621036    1/2010
(Continued)

OTHER PUBLICATIONS

"IBM Builds World's Fastest Communications Microchip", Reuters U.S. Company News, Feb. 25, 2002, online at http://activequote300.fidelity.com/rtrnews/individual_n.../COMP&provider=CBSMW%26toc_select%3Dmarket_breaking_news, 1 page.
(Continued)

*Primary Examiner* — Nathan W Ha

(57) ABSTRACT

Some embodiments include thyristors having first and second electrode regions, first and second base regions, and material having a bandgap of at least 1.2 eV in at least one of the regions. The first base region is between the first electrode region and the second base region, and the second base region is between the second electrode region and the first base region. The first base region interfaces with the first electrode region at a first junction, and interfaces with the second base region at a second junction. The second base region interfaces with the second electrode region at a third junction. A gate is along the first base region, and in some embodiments does not overlap either of the first and second junctions. Some embodiments include methods of programming thyristors, and some embodiments include methods of forming thyristors.

7 Claims, 29 Drawing Sheets

Related U.S. Application Data division of application No. 13/043,295, filed on Mar. 8, 2011, now Pat. No. 8,519,431.

(51) Int. Cl.

| | | |
|---|---|---|
| *H01L 27/08* | (2006.01) | |
| *H01L 27/102* | (2006.01) | |
| *H01L 29/745* | (2006.01) | |
| *H01L 21/306* | (2006.01) | |
| *H01L 21/762* | (2006.01) | |
| *H01L 29/749* | (2006.01) | |

(52) U.S. Cl.
CPC ...... *H01L 27/1027* (2013.01); *H01L 29/7455* (2013.01); *H01L 21/30604* (2013.01); *H01L 21/76224* (2013.01); *H01L 29/749* (2013.01)

(58) Field of Classification Search
CPC ....... H01L 21/76224; H01L 21/823412; H01L 27/105; H01L 27/0817
USPC .................................................. 438/133, 134
See application file for complete search history.

(56) References Cited

U.S. PATENT DOCUMENTS

| | | | |
|---|---|---|---|
| 5,098,861 | A | 3/1992 | Blackstone |
| 5,102,821 | A | 4/1992 | Moslehi |
| 5,106,776 | A | 4/1992 | Shen et al. |
| 5,260,233 | A | 11/1993 | Buti et al. |
| 5,373,184 | A | 12/1994 | Moslehi |
| 5,378,316 | A | 1/1995 | Franke et al. |
| 5,412,598 | A | 5/1995 | Shulman |
| 5,465,249 | A | 11/1995 | Cooper, Jr. et al. |
| 5,471,039 | A | 11/1995 | Irwin, Jr. et al. |
| 5,510,630 | A | 4/1996 | Agarwal et al. |
| 5,563,084 | A | 10/1996 | Ramm et al. |
| 5,600,160 | A | 2/1997 | Hvistendahl |
| 5,874,760 | A | 2/1999 | Burns, Jr. et al. |
| 5,904,507 | A | 5/1999 | Thomas |
| 5,909,618 | A | 6/1999 | Forbes et al. |
| 5,920,105 | A | 7/1999 | Okamoto et al. |
| 5,930,640 | A | 7/1999 | Kenney |
| 5,936,274 | A | 8/1999 | Forbes et al. |
| 5,963,469 | A | 10/1999 | Forbes |
| 6,017,778 | A | 1/2000 | Pezzani |
| 6,033,957 | A | 3/2000 | Burns, Jr. et al. |
| 6,137,128 | A | 10/2000 | Holmes et al. |
| 6,191,476 | B1 | 2/2001 | Takahashi et al. |
| 6,225,151 | B1 | 5/2001 | Gardner et al. |
| 6,225,165 | B1 | 5/2001 | Noble, Jr. et al. |
| 6,229,161 | B1 | 5/2001 | Nemati et al. |
| 6,245,663 | B1 | 6/2001 | Zhao et al. |
| 6,255,731 | B1 | 7/2001 | Ohmi et al. |
| 6,274,888 | B1 | 8/2001 | Suzuki et al. |
| 6,294,418 | B1 | 9/2001 | Noble |
| 6,303,468 | B1 | 10/2001 | Aspar et al. |
| 6,335,231 | B1 | 1/2002 | Yamazaki et al. |
| 6,335,258 | B1 | 1/2002 | Aspar et al. |
| 6,352,894 | B1 | 3/2002 | Goebel et al. |
| 6,355,501 | B1 | 3/2002 | Fung et al. |
| 6,355,520 | B1 | 3/2002 | Park et al. |
| 6,365,488 | B1 | 4/2002 | Liao |
| 6,391,658 | B1 | 5/2002 | Gates et al. |
| 6,492,662 | B2 | 12/2002 | Hsu et al. |
| 6,525,953 | B1 | 2/2003 | Johnson |
| 6,559,471 | B2 | 5/2003 | Finder et al. |
| 6,576,944 | B2 | 6/2003 | Weis |
| 6,593,624 | B2 | 7/2003 | Walker |
| 6,600,173 | B2 | 7/2003 | Tiwari |
| 6,627,924 | B2 | 9/2003 | Hsu et al. |
| 6,649,980 | B2 | 11/2003 | Noguchi |
| 6,653,174 | B1 | 11/2003 | Cho et al. |
| 6,690,038 | B1 | 2/2004 | Cho et al. |
| 6,690,039 | B1 | 2/2004 | Nemati et al. |
| 6,713,791 | B2 | 3/2004 | Hsu et al. |
| 6,713,810 | B1 | 3/2004 | Bhattacharyya |
| 6,727,529 | B2 | 4/2004 | Nemati et al. |
| 6,744,094 | B2 | 6/2004 | Forbes |
| 6,756,286 | B1 | 6/2004 | Moricesu et al. |
| 6,764,774 | B2 | 7/2004 | Grill et al. |
| 6,768,156 | B1 | 7/2004 | Bhattacharyya |
| 6,809,044 | B1 | 10/2004 | Aspar et al. |
| 6,812,504 | B2 | 11/2004 | Bhattacharyya |
| 6,815,781 | B2 | 11/2004 | Vyvoda et al. |
| 6,841,813 | B2 | 1/2005 | Walker et al. |
| 6,845,034 | B2 | 1/2005 | Bhattacharyya |
| 6,870,202 | B2 | 3/2005 | Oka |
| 6,881,994 | B2 | 4/2005 | Lee et al. |
| 6,882,008 | B1 | 4/2005 | Ohsawa |
| 6,888,199 | B2 | 5/2005 | Nowak et al. |
| 6,891,205 | B1 | 5/2005 | Cho et al. |
| 6,906,354 | B2 | 6/2005 | Hsu et al. |
| 6,914,286 | B2 | 7/2005 | Park |
| 6,934,209 | B2 | 8/2005 | Marr |
| 6,940,748 | B2 | 9/2005 | Nejad et al. |
| 6,940,761 | B2 | 9/2005 | Forbes |
| 6,946,365 | B2 | 9/2005 | Aspar et al. |
| 6,953,953 | B1 | 10/2005 | Horch |
| 6,958,263 | B2 | 10/2005 | Bhattacharyya |
| 6,958,513 | B2 | 10/2005 | Wang |
| 6,965,129 | B1 | 11/2005 | Horch et al. |
| 6,992,349 | B2 | 1/2006 | Lee et al. |
| 6,995,456 | B2 | 2/2006 | Nowak |
| 7,015,092 | B2 | 3/2006 | Jaiprakash et al. |
| 7,029,956 | B2 | 4/2006 | Hsu et al. |
| 7,052,941 | B2 | 5/2006 | Lee |
| 7,075,146 | B2 | 7/2006 | Forbes |
| 7,081,663 | B2 | 7/2006 | Bulucea |
| 7,115,939 | B2 | 10/2006 | Forbes |
| 7,120,046 | B1 | 10/2006 | Forbes |
| 7,129,568 | B2 | 10/2006 | Lee |
| 7,151,024 | B1 | 12/2006 | Forbes |
| 7,157,771 | B2 | 1/2007 | Forbes |
| 7,158,401 | B2 | 1/2007 | Bhattacharyya |
| RE39,484 | E | 2/2007 | Bruel |
| 7,180,135 | B1 | 2/2007 | Ioannou |
| 7,195,959 | B1 | 3/2007 | Plummer et al. |
| 7,205,185 | B2 | 4/2007 | Dokumaci et al. |
| 7,250,628 | B2 | 7/2007 | Bhattacharyya |
| 7,250,646 | B2 | 7/2007 | Walker et al. |
| 7,259,415 | B1 | 8/2007 | Forbes |
| 7,268,373 | B1 | 9/2007 | Gupta et al. |
| 7,271,052 | B1 | 9/2007 | Forbes |
| 7,279,740 | B2 | 10/2007 | Bhattacharyya et al. |
| 7,304,327 | B1 | 12/2007 | Nemati et al. |
| 7,323,380 | B2 | 1/2008 | Forbes |
| 7,326,969 | B1 | 2/2008 | Horch |
| 7,338,862 | B2 | 3/2008 | Huo et al. |
| 7,358,120 | B2 | 4/2008 | Furukawa et al. |
| 7,359,229 | B2 | 4/2008 | Ferrant et al. |
| 7,362,609 | B2 | 4/2008 | Harrison et al. |
| 7,368,352 | B2 | 5/2008 | Kim et al. |
| 7,378,325 | B2 | 5/2008 | Kaneko et al. |
| 7,410,867 | B2 | 8/2008 | Forbes |
| 7,415,690 | B2 | 8/2008 | Liang et al. |
| 7,440,310 | B2 | 10/2008 | Bhattacharyya |
| 7,456,439 | B1 | 11/2008 | Horch |
| 7,476,939 | B2 | 1/2009 | Okhonin et al. |
| 7,488,627 | B1 | 2/2009 | Nemati et al. |
| 7,491,608 | B2 | 2/2009 | Forbes |
| 7,518,182 | B2 | 4/2009 | Abbott et al. |
| 7,525,137 | B2 | 4/2009 | Walker et al. |
| 7,538,000 | B2 | 5/2009 | Dao |
| 7,560,336 | B2 | 7/2009 | Abbott |
| 7,579,240 | B2 | 8/2009 | Forbes |
| 7,589,995 | B2 | 9/2009 | Tang et al. |
| 7,592,209 | B2 | 9/2009 | Chang |
| 7,615,436 | B2 | 11/2009 | Kouznetsov et al. |
| 7,619,917 | B2 | 11/2009 | Nirschl et al. |
| 7,629,651 | B2 | 12/2009 | Nakajima |
| 7,663,188 | B2 | 2/2010 | Chung |
| 7,736,969 | B2 | 6/2010 | Abbott et al. |
| 7,786,505 | B1 | 8/2010 | Yang et al. |

(56) References Cited

U.S. PATENT DOCUMENTS

| | | | |
|---|---|---|---|
| 7,816,728 B2 | 10/2010 | Ho et al. |
| 7,825,455 B2 | 11/2010 | Lee et al. |
| 7,838,360 B2 | 11/2010 | Forbes |
| 7,851,859 B2 | 12/2010 | Tak et al. |
| 7,883,962 B2 | 2/2011 | Noble |
| 7,897,440 B1 | 3/2011 | Horch |
| 7,929,343 B2 | 4/2011 | Tang et al. |
| 8,018,058 B2 | 9/2011 | Lee |
| 8,084,316 B2 | 12/2011 | Huo et al. |
| 8,102,025 B2 | 1/2012 | Ozeki et al. |
| 8,148,780 B2 | 4/2012 | Tang et al. |
| 8,501,559 B2 | 8/2013 | Tang et al. |
| 8,501,581 B2 | 8/2013 | Tang et al. |
| 8,507,966 B2 | 8/2013 | Tang et al. |
| 8,518,812 B2 | 8/2013 | Mariani et al. |
| 8,519,431 B2 | 8/2013 | Nemati et al. |
| 8,524,543 B2 | 9/2013 | Tang |
| 8,558,220 B2 | 10/2013 | Schricker et al. |
| 8,598,621 B2 | 12/2013 | Tang |
| 8,772,848 B2 | 7/2014 | Zahurak |
| 2001/0002062 A1* | 5/2001 | Noble, Jr. ............... G11C 11/39 257/565 |
| 2001/0024841 A1 | 9/2001 | Noble, Jr. et al. |
| 2001/0026477 A1 | 10/2001 | Manning |
| 2001/0048119 A1 | 12/2001 | Mizuno et al. |
| 2002/0024152 A1 | 2/2002 | Momoi et al. |
| 2002/0028541 A1 | 3/2002 | Lee et al. |
| 2002/0070454 A1 | 6/2002 | Yasukawa |
| 2002/0079537 A1 | 6/2002 | Houston |
| 2002/0081753 A1 | 6/2002 | Gates et al. |
| 2002/0094619 A1 | 7/2002 | Mandelman et al. |
| 2002/0142562 A1 | 10/2002 | Chan et al. |
| 2002/0158254 A1* | 10/2002 | Hsu .................. H01L 21/8213 257/77 |
| 2002/0163019 A1 | 11/2002 | Mohsen |
| 2002/0185684 A1 | 12/2002 | Campbell et al. |
| 2002/0190265 A1 | 12/2002 | Hsu et al. |
| 2002/0190298 A1 | 12/2002 | Alsmeier et al. |
| 2003/0006461 A1 | 1/2003 | Tezuka et al. |
| 2003/0102469 A1 | 6/2003 | Jones |
| 2003/0164501 A1 | 9/2003 | Suzuki et al. |
| 2003/0211705 A1 | 11/2003 | Tong et al. |
| 2003/0223292 A1 | 12/2003 | Nejad et al. |
| 2003/0235710 A1 | 12/2003 | Grill et al. |
| 2004/0007717 A1 | 1/2004 | Yoo |
| 2004/0022105 A1 | 2/2004 | Ohsawa |
| 2004/0094758 A1 | 5/2004 | Usuda et al. |
| 2004/0097022 A1 | 5/2004 | Werkhoven |
| 2004/0130015 A1 | 7/2004 | Ogihara et al. |
| 2004/0159853 A1 | 8/2004 | Nemati et al. |
| 2004/0174734 A1 | 9/2004 | Forbes |
| 2004/0214379 A1 | 10/2004 | Lee et al. |
| 2004/0233761 A1 | 11/2004 | Schwabe et al. |
| 2004/0262635 A1 | 12/2004 | Lee |
| 2004/0262679 A1 | 12/2004 | Ohsawa |
| 2005/0001232 A1 | 1/2005 | Bhattacharyya |
| 2005/0037582 A1 | 2/2005 | Dennard et al. |
| 2005/0059252 A1 | 3/2005 | Dokumaci et al. |
| 2005/0062079 A1 | 3/2005 | Wu |
| 2005/0146955 A1 | 7/2005 | Kajiyama |
| 2005/0230356 A1 | 10/2005 | Empedocles et al. |
| 2005/0282318 A1 | 12/2005 | Dao |
| 2005/0282356 A1 | 12/2005 | Lee |
| 2006/0034116 A1 | 2/2006 | Lam et al. |
| 2006/0071074 A1 | 4/2006 | Konevecki et al. |
| 2006/0082004 A1 | 4/2006 | Parekh et al. |
| 2006/0099776 A1 | 5/2006 | Dupont |
| 2006/0124974 A1 | 6/2006 | Cabral et al. |
| 2006/0125011 A1 | 6/2006 | Chang |
| 2006/0197115 A1 | 9/2006 | Toda |
| 2006/0220085 A1 | 10/2006 | Huo et al. |
| 2006/0227601 A1 | 10/2006 | Bhattacharyya |
| 2006/0249770 A1 | 11/2006 | Huo et al. |
| 2007/0012945 A1 | 1/2007 | Sugizaki |
| 2007/0018166 A1 | 1/2007 | Atanackovic et al. |
| 2007/0018223 A1 | 1/2007 | Abbott |
| 2007/0023805 A1 | 2/2007 | Wells et al. |
| 2007/0029607 A1 | 2/2007 | Kouznetzov |
| 2007/0045709 A1 | 3/2007 | Yang |
| 2007/0047364 A1 | 3/2007 | Chuang et al. |
| 2007/0057328 A1 | 3/2007 | Taniguchi et al. |
| 2007/0064342 A1 | 3/2007 | Nakamura |
| 2007/0077694 A1 | 4/2007 | Lee |
| 2007/0080385 A1 | 4/2007 | Kim et al. |
| 2007/0121696 A1 | 5/2007 | Ishii |
| 2007/0127289 A1 | 6/2007 | Lee |
| 2007/0215954 A1 | 9/2007 | Mouli |
| 2007/0252175 A1 | 11/2007 | Tang et al. |
| 2007/0264771 A1 | 11/2007 | Ananthan et al. |
| 2008/0003774 A1 | 1/2008 | Baek |
| 2008/0003778 A1 | 1/2008 | Eyck |
| 2008/0124867 A1 | 5/2008 | Brown |
| 2008/0128802 A1 | 6/2008 | Huo et al. |
| 2008/0149984 A1 | 6/2008 | Chang et al. |
| 2008/0164528 A1 | 7/2008 | Cohen et al. |
| 2008/0211023 A1 | 9/2008 | Shino |
| 2008/0211061 A1 | 9/2008 | Atwater, Jr. et al. |
| 2008/0233694 A1 | 9/2008 | Li |
| 2008/0237776 A1 | 10/2008 | Abbott |
| 2008/0246023 A1 | 10/2008 | Zeng et al. |
| 2008/0296712 A1 | 12/2008 | Feuillet |
| 2008/0299753 A1 | 12/2008 | Figura et al. |
| 2009/0003025 A1 | 1/2009 | Mokhlesi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Ananthan |
| 2009/0050948 A1 | 2/2009 | Ishikawa |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0129145 A1 | 5/2009 | Slesazeck |
| 2009/0140290 A1 | 6/2009 | Schulze et al. |
| 2009/0170261 A1 | 7/2009 | Lee |
| 2009/0173984 A1 | 7/2009 | Wang |
| 2009/0179262 A1 | 7/2009 | Holz |
| 2009/0189228 A1 | 7/2009 | Zhang et al. |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Slesazeck |
| 2009/0218656 A1 | 9/2009 | Gonzalez et al. |
| 2009/0242865 A1 | 10/2009 | Lung et al. |
| 2009/0246952 A1 | 10/2009 | Ishizaka et al. |
| 2009/0250738 A1 | 10/2009 | Dyer |
| 2009/0315084 A1 | 12/2009 | Cha et al. |
| 2010/0001271 A1 | 1/2010 | Mieno |
| 2010/0006938 A1 | 1/2010 | Jang |
| 2010/0008139 A1 | 1/2010 | Bae |
| 2010/0044670 A1 | 2/2010 | Ling |
| 2010/0061145 A1 | 3/2010 | Weis |
| 2010/0197141 A1 | 8/2010 | Tu et al. |
| 2010/0200916 A1 | 8/2010 | Gossner et al. |
| 2010/0203695 A1 | 8/2010 | Oh et al. |
| 2010/0207180 A1 | 8/2010 | Lee |
| 2010/0248153 A1 | 9/2010 | Lee et al. |
| 2010/0277982 A1 | 11/2010 | Okhonin |
| 2011/0006377 A1 | 1/2011 | Lee et al. |
| 2011/0024791 A1 | 2/2011 | Schulze et al. |
| 2011/0156044 A1 | 6/2011 | Lee et al. |
| 2011/0163357 A1 | 7/2011 | Tan et al. |
| 2011/0215371 A1 | 9/2011 | Tang et al. |
| 2011/0215396 A1 | 9/2011 | Tang et al. |
| 2011/0215407 A1 | 9/2011 | Tang et al. |
| 2011/0215408 A1 | 9/2011 | Tang et al. |
| 2011/0215436 A1 | 9/2011 | Tang et al. |
| 2011/0223725 A1 | 9/2011 | Kang et al. |
| 2011/0223731 A1 | 9/2011 | Chung et al. |
| 2012/0205736 A1 | 8/2012 | Housley et al. |
| 2012/0223369 A1 | 9/2012 | Gupta et al. |
| 2012/0223380 A1 | 9/2012 | Lee et al. |

(56) References Cited

U.S. PATENT DOCUMENTS

2014/0008721 A1 1/2014 Filippini et al.
2014/0106554 A1 4/2014 Pozzi et al.

FOREIGN PATENT DOCUMENTS

| | | |
|---|---|---|
| CN | 201180011628.6 | 6/2014 |
| CN | 201180011630.3 | 7/2014 |
| CN | 201180011589 | 8/2014 |
| CN | 201180011628.6 | 2/2015 |
| CN | 201180011589 | 4/2015 |
| EP | 1918998 | 5/2008 |
| EP | 11751053 | 6/2014 |
| EP | 11751050 | 11/2014 |
| JP | H02-275663 | 11/1990 |
| JP | H04-064249 | 2/1992 |
| JP | H04-186815 | 7/1992 |
| JP | H04-283914 | 10/1992 |
| JP | 06-10446 | 4/1994 |
| JP | H08-088153 | 4/1996 |
| JP | H10-150176 | 6/1998 |
| JP | H11-103035 | 4/1999 |
| JP | 2000-150905 | 5/2000 |
| JP | 2003-030980 | 1/2003 |
| JP | 2004-3030398 | 10/2004 |
| JP | 2005-136191 | 5/2005 |
| JP | 2005-327766 | 11/2005 |
| JP | 2007-511895 | 5/2007 |
| JP | 2008-010503 | 1/2008 |
| JP | 2009531860 | 9/2009 |
| JP | 2011-508979 | 3/2011 |
| KR | 10-0663359 | 10/2006 |
| KR | 10-0702014 | 11/2006 |
| KR | 10-0821456 | 4/2008 |
| KR | 2009-0040460 | 4/2009 |
| KR | 2009-0054245 | 5/2009 |
| KR | 10-2010-0070835 | 8/2010 |
| TW | 200802866 | 1/2008 |
| TW | 101104088 | 12/2013 |
| TW | 100106777 | 2/2014 |
| TW | 101106601 | 4/2014 |
| TW | 101107759 | 6/2014 |
| TW | 100106775 | 9/2014 |
| TW | 100106778 | 11/2014 |
| WO | WO 2007/123609 | 11/2007 |
| WO | WO 2009/088889 | 7/2009 |
| WO | WO PCT/US2011/024354 | 9/2011 |
| WO | WO PCT/US2011/024376 | 9/2011 |
| WO | WO PCT/US2011/024387 | 9/2011 |
| WO | WO PCT/US2012/021438 | 8/2012 |
| WO | WO PCT/US2011/024354 | 9/2012 |
| WO | WO PCT/US2011/024376 | 9/2012 |
| WO | WO PCT/US2011/024387 | 9/2012 |
| WO | WO PCT/US2012/025109 | 9/2012 |
| WO | WO PCT/US2012/025115 | 10/2012 |
| WO | WO PCT/US2012/021438 | 8/2013 |
| WO | WO PCT/US2012/025109 | 9/2013 |
| WO | WO PCT/US2012/025115 | 9/2013 |

OTHER PUBLICATIONS

Bae et al., "A Novel SiGe-Inserted SOI Structure for High Performance POSOI CMOSFET", IEEE Electron Devices Meeting, 2000, United States, pp. 667-670.
Belford et al., Performance-Augmented CMOS Using Back-End Uniaxial Strain, Device Research Conference Digest, 2002, United States, pp. 41-42.
Bhattacharyya, "The Role of Microelectronic Integration in Environmental Control: A Perspective", Materials Research Society Symposium Proceedings vol. 344, 1994, United States, pp. 281-293.
Burke et al., "Silicon Carbide Thyristors for Power Applications", 10th IEEE International Pulsed Power Conference Digest of Technical Papers vol. 1, 1995, United States, pp. 327-335.
Cheng et al., "SiGe-on-Insulator (SGOI): Substrate Preparation and MOSFET Fabrication for Electron Mobility Evaluation (and conference outline)", IEEE International SOI Conference, Oct. 2001, United States, pp. 13-14 and 3 page outline.
Cheong et al., "Investigation of Ultralow Leakage in MOS Capacitors on 4H SIC", IEEE Transactions on Electron Devices, vol. 51(9), Sep. 2004, United States, pp. 1361-1365.
Cho et al., "A Novel Capacitor-Less DRAM Cell Using Thin Capacitively-Coupled Thyristor (TCCT)", IEEE, 2005, United States, 4 pages.
Current et al., "Atomic-Layer Cleaving with SixGey Strain Layers for Fabrication of Si and Ge-Rich SOI Device Layers", IEEE International SOI Conference, Oct. 2001, United States, pp. 11-12.
Dimitraiadis et al., "New a-SiC, Optically Controlled, Thyristor-Like Switch", Electronics Letters, vol. 28(17), Aug. 13, 1992, United Kingdom, pp. 1622-1624.
Ernst et al., "Fabrication of a Novel Strained SiGe:C-channel Planar 55nm nMOSFET for High-Performance CMOS", Digest of Technical Papers—Symposium on VLSI Technology, 2002, United States, pp. 92-93.
Feder, "I.B.M. Finds Way to Speed Up Chips", The New York TImes, Jun. 8, 2001, reprinted from http://www.nytimes.com/2001/06/08/technology/08BLUE.html, 2 pages.
Garone et al., "Mobility Enhancement and Quantum Mechanical Modeling in GexSi1-x Channel MOSFETs from 90 to 300K", IEEE Electron Devices Meeting, 1991, United States, pp. 29-32.
Gu et al., "High Performance Sub-100 nm Si Thin-Film Transistors by Pattern-Controlled Crystallization of Thin Channel Layer and High Temperature Annealing", Device Research Conference Digest, 2002, United States, pp. 49-50.
Hara et al., "High Performance Poly-Si TFTs on a Glass by a Stable Scanning CW Laser Lateral Crystallization", IEEE Electron Devices Meeting, 2001, United States, pp. 747-750.
Hara et al., "Selective Single-Crystalling-Silicon Growth at the Pre-Defined Active Regions of TFTs on a Glass by a Scanning CW Layer Irradiation", IEEE Electron Devices Meeting, 2000, United States, pp. 209-212.
Huang et al., "Carrier Mobility Enhancement in Strained Si-on-Insulator Fabrication by Wafter Bonding", Digest of Technical Papers—Symposium on VLSI Technology, 2001, United States, pp. 57-58.
Jagar et al., "Single Grain Thin-Fim-Transistor (TFT) with SOI CMOS Performance Formed by Metal-Induced-Lateral-Crystallization", IEEE Electron Devices Meeting, 1999, United States, pp. 293-296.
Jen et al., "Electrical and Luminescent Characteristics of a-SiC:H P-I-N Thin-Film LED's with Graded-Gap Junctions", IEEE Transactions on Electron Devices, vol. 44(4), Apr. 1997, United States, pp. 565-571.
Jeon et al., "A New Poly-Si TFT with Selectivity Doped Channel Fabricated by Novel Excimer Laser Annealing", IEEE Electron Devices Meeting, 2000, United States, pp. 213-216.
Kesan et al., "High Performance 0.25 μm p-MOSFETs with Silicon-Geranium Channels for 300K and 77K Operation", IEEE Electron Devices Meeting, 1991, United States, pp. 25-28.
Kim et al., "A New High-Performance Poly-Si TFT by Simple Excimer Laser ANnealing on Selectively Floating a-Si Layer", IEEE Electron Devices Meeting, 2001, United States, pp. 751-754.
King et al, "A Low-Temperature (<550° C) Silicon-Geranium MOS Thin-Film Transistor Technology for Large-Area Electronics", IEEE Electron Devices Meeting, 1991, United States, pp. 567-570.

(56) References Cited

OTHER PUBLICATIONS

Kuriyama et al., "High Mobility Poly-Si TFT by a New Excimer Laser Annealing Method for Large Area Electronics", IEEE Electron Devices Meeting, 1991, United States, pp. 563-566.
Li et al., "Design of a High Speed Si/SiGe Heterojunction Complementary MOSFETs with Reduced Short-Channel Effects", National Central University, ChungLi, Taiwan, ROC, Aug. 2001, Contract No. NSC 89-2215-E-008-049, National Science Council of Taiwan, pp. 1 and 9.
Lu et al., "A Buried-Trench DRAM Cell Using a Self-Aligned Epitaxy Over Trench Technology", IEEE Electron Devices Meeting, 1988, United States, pp. 588-591.
Markoff, "I.B.M. Circuits are Now Faster and Reduce Use of Power", The New York Times, Feb. 25, 2002, reprinted Mar. 20, 2002, online http://story.news.yahoo.com/ news?tmpl<story&u=/nyt/20020225/.../i_b_m_circuits_are_now_faster_and_reduce_use_of_power, 1 page.
Mizuno et al., "High Performance CMOS Operation of Strained-SOI MOSFETs Using Thin Film SiGe-on-Insulator Substrate", Digest of Technical Papers—Symposium on VLSI Technology, 2002, United States, pp. 106-107.
Myers et al., "Deuterium Interactions in Oxygen-Implanted Copper", Journal of Applied Physics vol. 65(1), Jan. 1, 1989, United States, pp. 311-321.
Nayfeh et al., "Electron Inversion Layer Mobility in Strained-Si n-MOSFETS's with High Channel Doping Concentration Achieved by Ion Implantation", Device Research Conference Digest, 2002, United States, pp. 43-44.
Nemati et al., "A Novel High Density, Low Voltage SRAM Cell with a Vertical NDR Device", IEEE, 1998, United States, 2 pages.
Ono et al., "Analysis of Current-Voltage Characteristics in PolySIlicon TFTs for LCDs", IEEE Electron Devices Meeting, 1988, United States, pp. 256-259.
Park et al., "Normal Incident SiGe/Si Multiple Quantum Well Infrared Detector", IEEE Electron Devices Meeting, 1991, United States, pp. 749-752.
Powell et al., "SiC Materials—Progress, Status, and Potential Roadblocks", Proceedings of the IEEE vol. 90(6), Jun. 2002, United States, pp. 942-955.
Rim et al., "Characteristics and Device Design of Sub-100 nm Strained SiN- and PMOSFETs", Digest of Technical Papers—Symposium on VLSI Technology, 2002, United States, pp. 98-99.
Rim et al., "Strained Si NMOSFET's for High Performance CMOS Technology", Digest of Technical Papers—Symposium on VLSI Technology, 2001, United States, pp. 59-60.
Saggio et al., "Innovative Localized Lifetime Control in High-Speed IGBT's", IEEE Electron Device Letters vol. 18, No. 7, Jul. 1997, United States, pp. 333-335.
Sasago et al., "Cross-point phase change memory with 4F2 cell size driven by low-contact-resistivity 1 poly-Si diode", Digest of Technical Papers—Symposium on VLSI Technology, 2009, United States, pp. 24-25.

Shima et al., "<100> Channel Strained-SiGe p-MOSFET with Enhanced Hole Mobility and Lower Parasitic Resistance", Digest of Technical Papers—Symposium on VLSI Technology, 2002, United States, pp. 94-95.
Sugizaki et al., "35-nm Gate-Length and Ultra Low-voltage (0.45 V) Operation Bulk Thyristor-SRAMIDRAM (BT-RAM) Cell with Triple Selective Epitaxy Layers (TELs)", Digest of Technical Papers—Symposium on VLSI Technology, 2008, United States, 1 page (abstract).
Suliman et al., "Gate-Oxide Grown on the Sidewalls and Base of aU-Shaped Si Trench: Effects of the Oxide and Oxide/Si Interface Condition on the Properties of Vertical MOS Devices", Microelectronic Engineering vol. 72, 2004, Netherlands, pp. 247-252.
Takagi, "Strained-Si- and SiGe-on-Insulator (Strained SOI and SGOI) MOSFETs for High Performance/Low Power CMOS Application", Device Research Conference Digest, 2002. United States, pp. 37-40.
Tezuka et al., "High-Performance Strained Si-on-Insulator MOSFETs by Novel Fabrication Processes Utilizing Ge-Condensation Technique", Digest of Technical Papers—Symposium on VLSI Technology, 2002, United States, pp. 96-97.
Tzeng et al., "Dry Etching of Silicon Materials in SF6 Based Plasmas", Journal of The Electrochemical Society vol. 134, Issue 9, 1987, United States, pp. 2304-2309.
Sub-100 rim Applications", IEEE International Soi Conference, Oct. 2001. United States, pp. 45-46. Xie et al, "A Veritically Integrated Bipolar Storage Cell in 6H Silicon Carbide for Nonvolatile Memory.
Xie et al., "A Veritically Integrated Bipolar Storage Cell in 6H Silicon Carbide for Nonvolatile Memory Applications", IEEE Electron Device Letters vol. 15(6), Jun. 1994, United States, pp. 212-214.
Yamada et al., "Spread Source/Drain (SSD) MOSFET Using Selective Silicon Growth for 64Mbit DRAMs", IEEE Electron Devices Meeting, 1989, United States, pp. 35-38.
Yamauchi et al., "Drastically Improved Performance in Poly-Si TFTs with Channel Dimensions Comparable to Grain Size", IEEE Electron Devices Meeting, 1989, United States, pp. 353-356.
Yang at al., "High Performance CMOS Fabricated on Hybrid Substrate with Different Crystal Orientations", IEEE Electron Devices Meeting, 2003, United States, pp. 453-456.
Yu et al., "Low-Temperature Titanium-Based Wafer Bonding", Journal of the Electrocheical Society vol. 154, No. 1, 2007, United States, pp. H20-H25.
Mariani et al., U.S. Appl. No. 14/461,689 filed Aug. 18, 2014 titled "Methods of Forming an Array of Gated Devices", 30 pages.
Mariani et al., U.S. Appl. No. 14/461,751 filed Aug. 18, 2014 titled "Array of Gated Devices and Methods of Forming an Array of Gated Devices", 53 pages.
Righetti et al., U.S. Appl. No. 14/265,168 filed Apr. 29, 2014 titled "Methods of Forming Memory Arrays", 48 pages.
Zanderigo et al., U.S. Appl. No. 14/461,730 tiled Aug. 18, 2014 titled "Methods of Forming an Array of Gated Devioes", 29 pages.

* cited by examiner

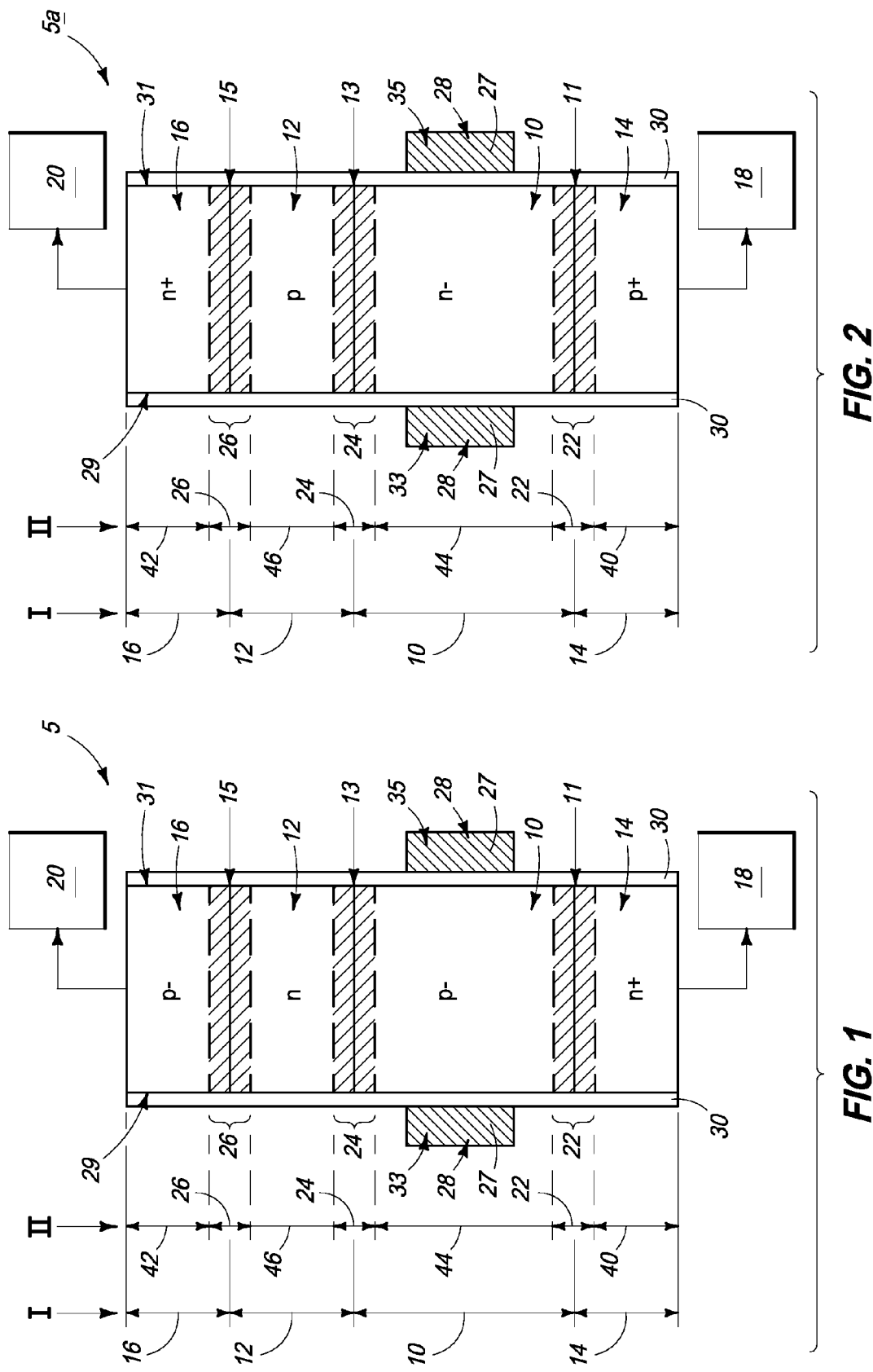

THYRISTORS, METHODS OF PROGRAMMING THYRISTORS, AND METHODS OF FORMING THYRISTORS

CROSS-REFERENCE TO RELATED APPLICATIONS

This application is a continuation of, and claims priority to, U.S. patent application Ser. No. 13/957,304, which was filed on Aug. 1, 2013, which is a divisional of, and claims priority to, U.S. patent application Ser. No. 13/043,295, which was filed on Mar. 8, 2011, now U.S. Pat. No. 8,519,431, which issued Aug. 27, 2013, the teachings of which are incorporated herein by reference.

TECHNICAL FIELD

Thyristors, methods of programming thyristors, and methods of forming thyristors.

BACKGROUND

Memory is one type of integrated circuitry, and is used in computer systems for storing data. Integrated memory is usually fabricated in one or more arrays of individual memory cells. The memory cells might be volatile, semi-volatile, or nonvolatile. Nonvolatile memory cells can store data for extended periods of time, and in some instances can store data in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds, or less.

The memory cells are configured to retain or store memory in at least two different selectable states. In a binary system, the states are considered as either a "0" or a "1". In other systems, at least some individual memory cells may be configured to store more than two levels or states of information.

Nonvolatile memory may be used in applications in which it is desired to retain data in the absence of power. Non-volatile memory may also be used in applications in which power is a limited resource (such as in battery-operated devices) as an alternative to volatile memory because non-volatile memory may have the advantage that it can conserve power relative to volatile memory. However, read/write characteristics of nonvolatile memory may be relatively slow in comparison to volatile memory, and thus volatile memory is still often used, even in devices having limited reserves of power. It would be desirable to develop improved nonvolatile memory and/or improved semi-volatile memory. It would be further desirable to develop memory cells that are nonvolatile or semi-volatile, while having suitable read/write characteristics to replace conventional volatile memory in some applications.

Integrated circuit fabrication continues to strive to produce smaller and denser integrated circuits. It can be desired to develop small-footprint memory cells in order to conserve the valuable real estate of an integrated circuit chip. For instance, it can be desired to develop memory cells that have a footprint of less than or equal to $4F^2$, where "F" is the minimum dimension of masking features utilized to form the memory cells.

One type of memory cell is a thyristor-based random access memory (T-RAM) cell. A thyristor is a bi-stable device that includes two electrode regions (an anode region and a cathode region) and two base regions between the electrode regions. The four regions are alternating p-type and n-type regions. For instance, an example configuration may have a p-type anode region, an n-type base, a p-type base, and an n-type cathode region arranged in a p-n-p-n configuration. A thyristor includes two main terminals, one at the anode region and one at the cathode region, and includes a control terminal. The control terminal is often referred to as a "gate," and may be electrically coupled with one of the base regions (conventionally, the gate is coupled to the base region nearest the cathode).

A thyristor in a memory device may be turned on by biasing the gate so that a p-n-p-n channel conducts a current. Once the device is turned on, often referred to as "latched," the thyristor does not require the gate to be biased to maintain the current conducted between the cathode and the anode. Instead, it will continue to conduct until a minimum holding current is no longer maintained between the anode and cathode, or until the voltage between the anode and the cathode is reversed. Accordingly, the thyristor may function as a switch or diode capable of being switched between an "on" state and an "off" state.

T-RAM cells may have faster switching speeds and lower operating voltages than conventional SRAM cells. However, T-RAM cells may also have lower than desired retention times, and may have a large footprint.

It would be desired to develop new memory cells which can be non-volatile or semi-volatile, and which have may have a footprint approaching $4F^2$.

BRIEF DESCRIPTION OF THE DRAWINGS

FIG. 1 is a diagrammatic cross-sectional view of an example embodiment memory cell.

FIG. 2 is a diagrammatic cross-sectional view of another example embodiment memory cell.

DETAILED DESCRIPTION OF THE ILLUSTRATED EMBODIMENTS

Figure 3:
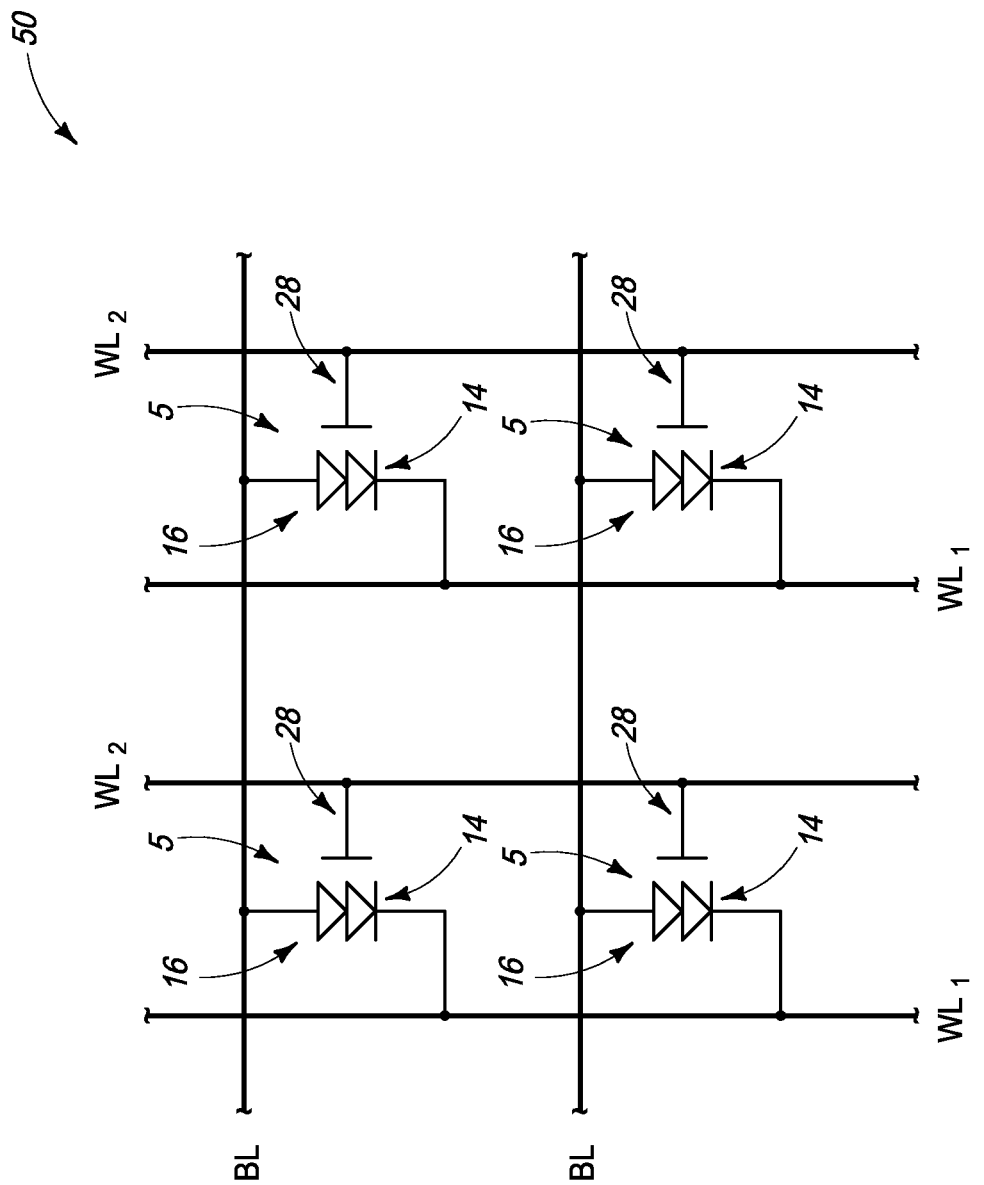
FIG. 3 is a diagrammatic schematic view of an example embodiment memory array comprising memory cells of the type shown in FIG. 1.

Some embodiments include thyristor-based memory cells comprising one or more wide-bandgap materials; with a "wide-bandgap material" being a material having a bandgap measurably greater than the 1.12 eV bandgap of silicon. In some embodiments, the wide-bandgap material may have a bandgap of 1.2 eV or greater. In some embodiments, the wide-bandgap material may have a bandgap of 2.3 eV or greater, and may, for example, comprise one or more forms of silicon carbide.

The utilization of the wide-bandgap material may enable formation RAM having a longer retention time than conventional T-RAM. In some embodiments, the wide-bandgap material may enable formation of thyristor-based memory having a retention time of several years, and thus may enable formation of nonvolatile memory. In some embodiments, the thyristor-based memory cells having wide-bandgap material therein may be fully compatible with operation in a memory array, and may be highly reliable in that they do not rely on impact ionization for operation.

Example thyristor-based memory cells are described with reference to FIGS. 1 and 2.

Referring to FIG. 1, a memory cell 5 comprises a pair of base regions 10 and 12 between a pair of electrode regions 14 and 16. The base regions 10 and 12 may be referred to as first and second base regions, respectively; and similarly the electrode regions 14 and 16 may be referred to as first and second electrode regions, respectively. One of the electrode regions 14 and 16 corresponds to an anode region and the other corresponds to a cathode region. The base regions 10 and 12 correspond to a p-type base region and an n-type base region (with region 10 being the p-type base region in the shown embodiment, and with region 12 being the n-type base region). The regions 14, 10, 12 and 16 are alternating n-type and p-type regions.

The first base region 10 interfaces with the first electrode region 14 at a junction 11, and interfaces with the second base region 12 at a junction 13. The second base region interfaces with the second electrode region 16 at a junction 15. The junctions 11, 13 and 15 may be referred to as first, second and third junctions, respectively.

The electrode regions 14 and 16 are shown to be electrically coupled to electrical nodes 18 and 20, respectively. One of the nodes 18 and 20 may correspond to a bitline (i.e., a digit line or sense line). The other of the nodes 18 and 20 may correspond to a wordline (i.e., an access line) in some embodiments, or to a ground or other electrically static structure in other embodiments.

The illustrated memory cell 5 shows one of many doping arrangements that may be utilized for the two bases and the two electrodes. Other doping arrangements may be utilized in other embodiments, with some examples of other doping arrangements being illustrated in FIGS. 2 and 13.

The various regions 10, 12, 14 and 16 of FIG. 1 are doped to various levels, with the symbols "+" and "−" being utilized to indicate some of the dopant levels. In various embodiments described herein, some or all of the designations p+, p, p−, n−, n and n+ may be used to indicate various levels and types of doping. The difference in dopant concentration between the regions identified as being p+, p, and p− may vary depending on the particular material being doped. An example dopant concentration of a p+ region is a dopant concentration of at least about $10^{19}$ atoms/cm$^3$ (and in some example applications may be from about $10^{19}$ atoms/cm$^3$ to about $10^{29}$ atoms/cm$^3$), an example dopant concentration of a p region is from about $10^{18}$ to about $10^{19}$ atoms/cm$^3$, and an example dopant concentration of a p− region is less than about $5 \times 10^{18}$ atoms/cm$^3$ (and in some embodiments may be less than about $5 \times 10^{17}$ atoms/cm$^3$). The regions identified as being n−, n and n+ may have dopant concentrations similar to those described above relative to the p−, p and p+ regions, respectively. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

The dopants utilized in memory cell 5 may be any suitable dopants. In some embodiments, at least part of the memory cell will comprise wide-bandgap material. An example wide-bandgap material is silicon carbide, and such may be n-type doped with, for example, one or more of N (such as from $N_2$ and/or $NH_3$), P (such as from $PH_3$) and As (such as from $AsH_3$); and p-type doped with, for example, one or more of B (such as from $B_2H_6$), Al (such as from $AlCl_3$, trimethylaluminum and triethylaluminum) and Ga (such as from trimethylgallium).

In operation, depletion regions 22, 24 and 26 may be generated across the junctions 11, 13 and 15, respectively. The depletion regions are diagrammatically illustrated with cross-hatching. Approximate boundaries of the depletion regions are illustrated with dashed lines.

The memory cell 5 has a gate 28 along the base region 10. Such gate is electrically coupled with the base region 10. The gate is a control terminal of the type described in the "Background" of this disclosure, and may be utilized for switching the thyristor of memory cell 5 between an "on" and "off" state.

The illustrated thyristor of memory cell 5 is configured as a vertical pillar having a pair of opposing sidewalls 29 and 31, and the gate 28 is shown to be bifurcated into a pair of segments 33 and 35, with each segment being along one of the opposing sidewalls. In some embodiments, the illustrated memory cell may be one of a plurality of memory cells of a memory array, and the illustrated segments 33 and 35 of the gate may correspond to a pair of lines that extend along multiple memory cells of a row or column of the array to interconnect multiple memory cells. Such lines would extend in and out of the page relative to the cross-sectional view of FIG. 1. The segments 33 and 35 would join with one another at some location along the lines so that the illustrated segments 33 and 35 are actually two parts of the same gate. In some embodiments, the gate may extend entirely around the base region 10 (a so-called gate all around construction) so that the gate is along sides of the base region 10 that are in and out of the page relative to the view of FIG. 1, and in some embodiments the gate may be only along the opposing sides of the base shown in FIG. 1.

The gate 28 comprises a material 27. Such material may comprise any suitable substance; and may, for example, comprise one or more of various metals (for instance, titanium, tungsten, etc.), metal-containing compositions (for instance, metal silicide, metal nitride, etc.), and conductively-doped semiconductor materials (for instance, conductively-doped silicon, conducted-doped geranium, etc.).

The gate 28 is spaced from the sidewalls 29 and 31 of the thyristor pillar by dielectric material 30. The dielectric material may comprise any suitable composition or combination of compositions. In some embodiments, at least a portion of the thyristor pillar comprises one or more forms of silicon carbide, and at least a portion of the dielectric material 30 that is directly against the silicon carbide comprises a passivation composition containing silicon, oxygen and nitrogen. Such passivation composition may be formed by chemically reacting a surface of the silicon carbide with oxygen and nitrogen, and/or by depositing a composition containing silicon, oxygen and nitrogen along the surface of the silicon carbide.

In some embodiments, an entirety of dielectric material 30 may comprise the passivation composition containing silicon, oxygen and nitrogen. In other embodiments, the dielectric material 30 may comprise two or more different compositions, with the composition directly against surfaces of the thyristor pillar being the passivation material, and with one or more other compositions being between the passivation material and the gate 28. Such other compositions may comprise, for example, one or more of silicon dioxide and silicon nitride.

In the shown embodiment, the gate 28 is along base region 10 of the thyristor, but does not overlap the junctions 11 and 13. Further, the gate does not overlap the depletion regions 22 and 24 during operation of the thyristor. In the shown configuration in which the thyristor is a vertical pillar, the gate 28 may be considered to vertically overlap the base region 10, and to not vertically overlap the depletion regions 22 and 24.

It can be advantageous for gate 28 to not overlap depletion regions 22 and 24 in that such can alleviate or eliminate a source of leakage within the memory cell. Specifically, a thyristor-based memory cell may have primary leakage mechanisms that include gate-induced leakage (which may be referred to as gate-induced-drain-leakage, i.e., GIDL), and leakage through the various junctions (i.e., junction leakage). If the gate 28 overlaps the depletion regions, then a significant leakage mechanism within the memory cell may be gate-induced leakage, and such may be a much larger contribution to the leakage within the memory cell then the junction leakages. However, in the shown example embodiment of FIG. 1 the gate does not overlap the depletion regions, and thus only couples with the base region. Accordingly, the gate-induced leakage, if any, may be a small contribution to the overall leakage within the memory cell; and thus the overall leakage through the memory cell may be reduced. This can enable the memory cell of FIG. 1 to have much longer retention times than conventional T-RAM, and in some environments to have retention times suitable for utilization in nonvolatile memory.

The thyristor pillar of memory cell 5 may be considered to be subdivided into numerous regions, as explained with reference to the scales I and II shown in FIG. 1.

Scale I illustrates that the thyristor pillar may be considered to be subdivided into the first electrode region 14, the first base region 10, the second base region 12, and the second electrode region 16. The regions 14 and 10 interface at the junction 11, the regions 10 and 12 interface at the junction 13, and the regions 12 and 16 interface at the junction 15.

Scale II illustrates that the thyristor pillar may be considered to comprise a first outer region 40 corresponding to the portion of the electrode region 14 that is outward of the depletion region 22, a second outer region 42 corresponding to the portion of the electrode region 16 that is outward of the depletion region 26, a first inner region 44 between the depletion regions 22 and 24, and a second inner region 46 between the depletion regions 24 and 26.

As discussed above, the thyristor pillar may comprise one or more wide-bandgap materials. The wide-bandgap materials may advantageously improve retention time of the memory cell relative to narrower bandgap materials (such as silicon) by reducing leakage within the memory cell. In some embodiments, wide-bandgap materials are provided at least across the junctions 11 and 13 in wide enough expanses to fully encompass depletion regions 22 and 24. Thus, the wide-bandgap materials are provided across the locations where the wide-bandgap materials may reduce junction leakage. In some embodiments, the wide-bandgap materials may be provided as strips extending across depletion regions 22 and 24, and thus the regions 40, 44 and 46 of scale II may be narrow bandgap materials (such as silicon). In such embodiments, the wide-bandgap strips across depletion regions 22 and 24 may be the same composition as one another, and in other embodiments such wide-bandgap strips may be different compositions from one another.

In addition to being provided across the junctions, the wide-bandgap materials may be provided anywhere in the thyristor pillar where leakage may be problematic. For instance, it may be advantageous to provide wide-bandgap material to be across the region 40 of scale II when such region corresponds to part of a cathode region of the thyristor. In such embodiments, the wide-bandgap material across region 40 may be the same or different than the wide-bandgap material across one or both of the depletion regions 22 and 24. It may also be advantageous to provide wide-bandgap material within the one or both of regions 44 and 46 of scale II to either alleviate leakage, or to simplify fabrication of memory cell 5 in embodiments in which wide-bandgap material as provided within depletion regions 22 and 24. In some embodiments, wide-bandgap material is provided across all of the regions 40, 22, 44, 24, 46, 26 and 42 of scale II. In such embodiments, the same wide-bandgap material may be provided across all of the regions 40, 22, 44, 24, 46, 26 and 42 so that the entirety of the vertical thyristor pillar comprises, consists essentially of, or consists of only one wide-bandgap material. In other embodiments, one or more of the regions 40, 22, 44, 24, 46, 26 and 42 may comprise a different wide-bandgap material than another region to tailor the memory cell 5 for a particular application.

The wide-bandgap material may comprise any suitable composition. In some embodiments, the wide-bandgap material may comprise silicon and carbon, and may comprise one or more forms of silicon carbide. For instance, the wide-bandgap material may comprise, consist essentially of, or consist of the 3C form of silicon carbide in some embodiments, and thus may have a bandgap greater than 2.3 eV (specifically, such form of SiC has a band gap of 2.36 eV).

FIG. 2 shows an example embodiment memory cell 5a analogous to the memory cell 5 of FIG. 1, but comprising an npnp thyristor rather than a pnpn thyristor. The memory cell 5a of FIG. 2 is labeled with identical numbering to that used above to describe FIG. 1, and comprises identical features as the memory cell of FIG. 1, except for the different dopant type utilized in the electrode regions and base regions.

The memory cells of FIGS. 1 and 2 may be utilized in memory arrays. FIG. 3 diagrammatically illustrates a memory array 50 comprising a plurality of memory cells 5 of the type described above with reference to FIG. 1. Each memory cell is schematically illustrated as a thyristor, with the electrode regions 14 and 16 being a cathode and an anode, respectively.

The memory array 50 comprises a series of bitlines (the series identified as BL), a first series of wordlines (the series identified as $WL_1$), and a second series of wordlines (the series identified as $WL_2$). In some embodiments, the node 20 of FIG. 1 may correspond to a bitline (BL), the node 18 of FIG. 1 may correspond to a wordline of the first series ($WL_1$) and the gate 26 of FIG. 1 may be along a wordline of the second series ($WL_2$). In such embodiments, the electrode regions 14 of memory cells 5 may be considered to be first electrode regions which are directly coupled with a first series of wordlines, and the electrode regions 16 of the memory cells may be considered to be second electrode regions which are electrically coupled with bitlines. Each memory cell of array 50 may be uniquely addressed through combinations containing one of the bitlines together with one of the wordlines $WL_2$ and/or one of the wordlines $WL_1$. The wordlines may be alternatively referred to as access lines in some embodiments, and the bitlines may be alternatively referred to as sense lines in some embodiments.

Figure 4:
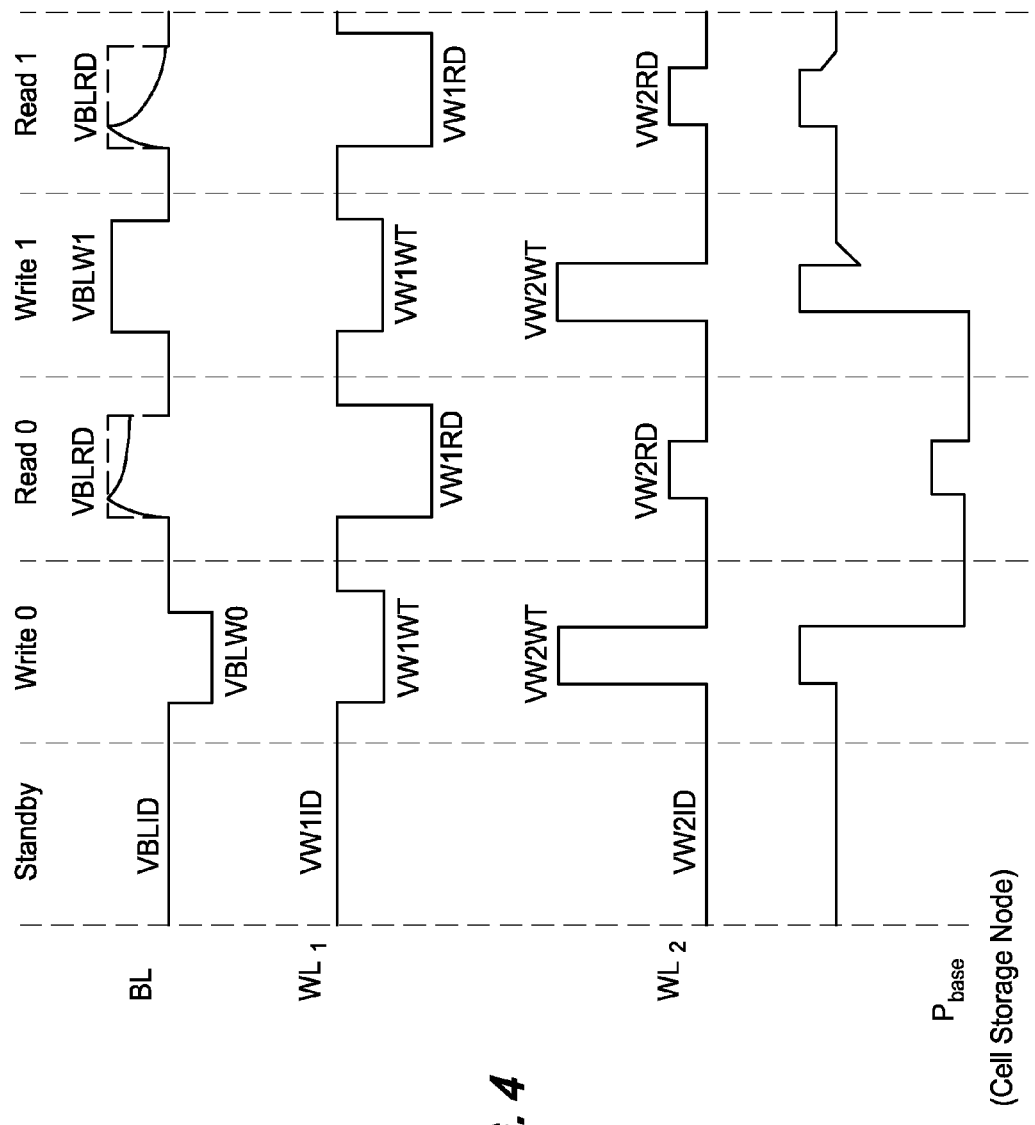
FIG. 4 diagrammatically illustrates an example embodiment operational arrangement for utilizing the memory array of FIG. 3.

FIG. 4 diagrammatically illustrates various operations that may be utilized for programming individual memory cells of the array 50 into a "0" data state (i.e., "write 0" operations), programming the individual memory cells into a "1" data state (i.e., "write 1" operations), and for reading the memory cells to ascertain the data states of the individual memory cells. FIG. 4 also diagrammatically illustrates charge stored on the $P_{base}$ (i.e., the base 10 of FIG. 1) during the various operations. Example voltage levels for the various states indicated in FIG. 4 may include (assuming a bandgap of 2.3 eV):

VBLID=1.5 Volt (V)
VBLW0=1.5V
VBLRD=3V (D0, 3V; D1, 2.5V)
VBLW1=3V
VW1ID=1.5V
VW1WT=0V
VW1RD=0V
VW2ID=−3V
VW2WT=2V
VW2RD=−1.4V The terms "D0" and "D1" indicate voltages read for the "0" data state and the "1" data state, respectively, of a memory cell.

Another set of example voltage levels for the various states indicated in FIG. 4 may include (assuming a bandgap of 2.3 eV):

VBLID=2V
VBLW0=2V
VBLRD=3.2V (D0, 3.2V; D1, 2.5V)
VBLW1=3.2V
VW1ID=2V
VW1WT=0.5V
VW1RD=0V
VW2ID=−3V
VW2WT=2V
VW2RD=−1.4V

It is noted that the "write 0" operation has a lower voltage differential between $WL_1$ and the bitline than does the "write 1" operation. The lower voltage differential between the bitline and $WL_1$ allows charge to drain from the $P_{base}$, while the higher voltage differential between the bitline and $WL_1$ results in charge being trapped on the $P_{base}$. Various mechanisms may account for such relationship. For instance, high-voltage differentials between the bitline and $WL_1$ during capacitive coupling of the base 10 with gate 28 can lead to latching and/or other mechanisms which limit charge transfer through the thyristor, and thus can lead to charge being trapped on the base 10. In contrast, low-voltage differentials between the bitline and $WL_1$ during the capacitive coupling of the gate with the base may permit a steady flow of charge through the thyristor, and thus may permit charge to be drained from the base 10.

Figure 5:
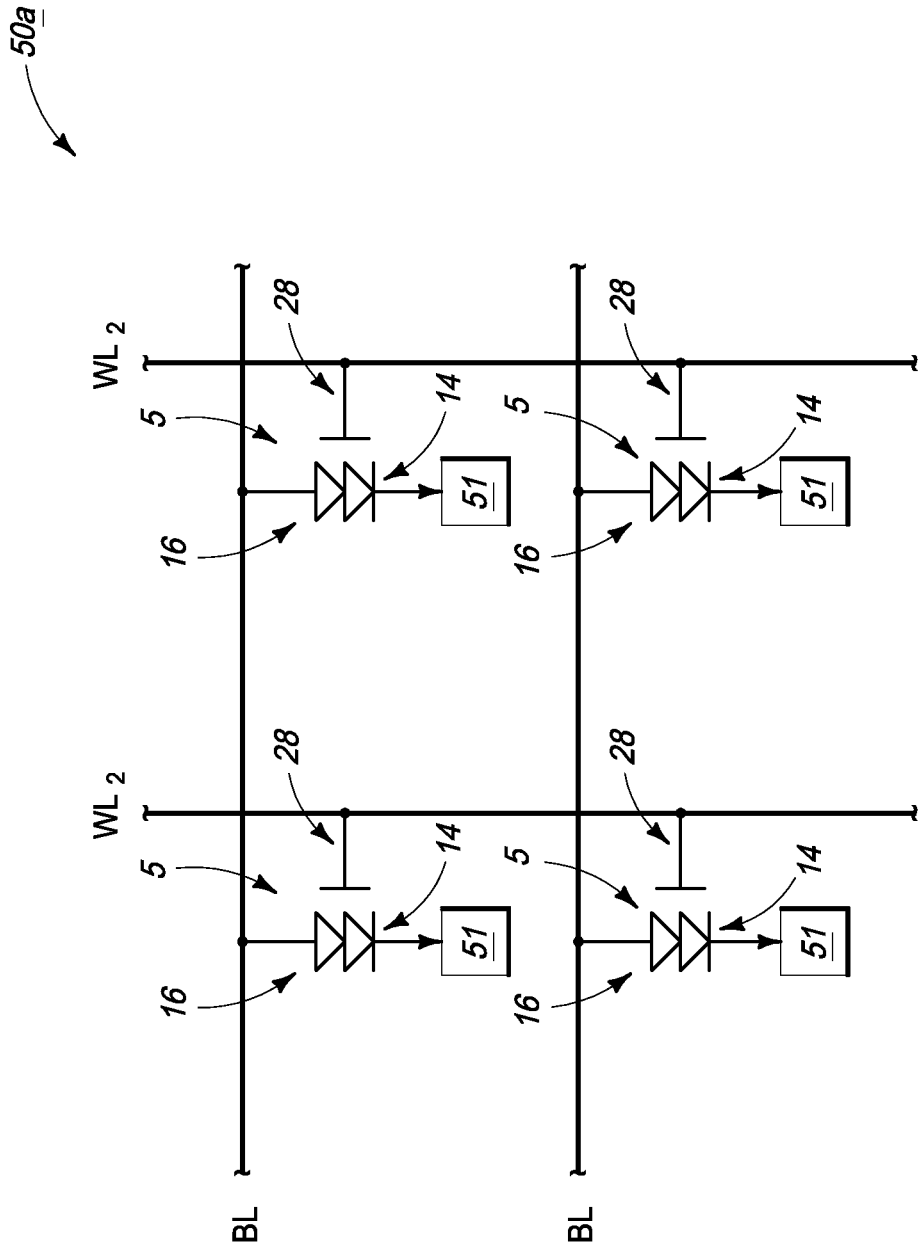
FIG. 5 is a diagrammatic schematic view of another example embodiment memory array comprising memory cells of the type shown in FIG. 1.

FIG. 5 diagrammatically illustrates another example embodiment memory array 50a comprising a plurality of memory cells 5 of the type described above with reference to FIG. 1. The memory array of FIG. 5 is similar to that of FIG. 3, except that the first series of wordlines ($WL_1$ of FIG. 3) has been replaced with nodes 51. The nodes 51 are at a common voltage as one another, and in some embodiments may be electrically coupled with one another and with a common terminal (for instance, they may all be connected to a grounded plate).

In some embodiments, the node 20 of FIG. 1 may correspond to the bitline (BL) of FIG. 5, the node 18 of FIG. 1 may correspond to one of the nodes 51, and the gate 28 of FIG. 1 may be along a wordline of the series ($WL_2$). In such embodiments, the electrode regions 14 of memory cells 5 may be considered to be first electrode regions which are electrically coupled with one another and with a common terminal; and the electrode regions 16 of the memory cells may be considered to be second electrode regions which are electrically coupled with bitlines. Each memory cell of array 50a may be uniquely addressed through combinations containing one of the bitlines together with one of the wordlines $WL_2$.

Figure 6:
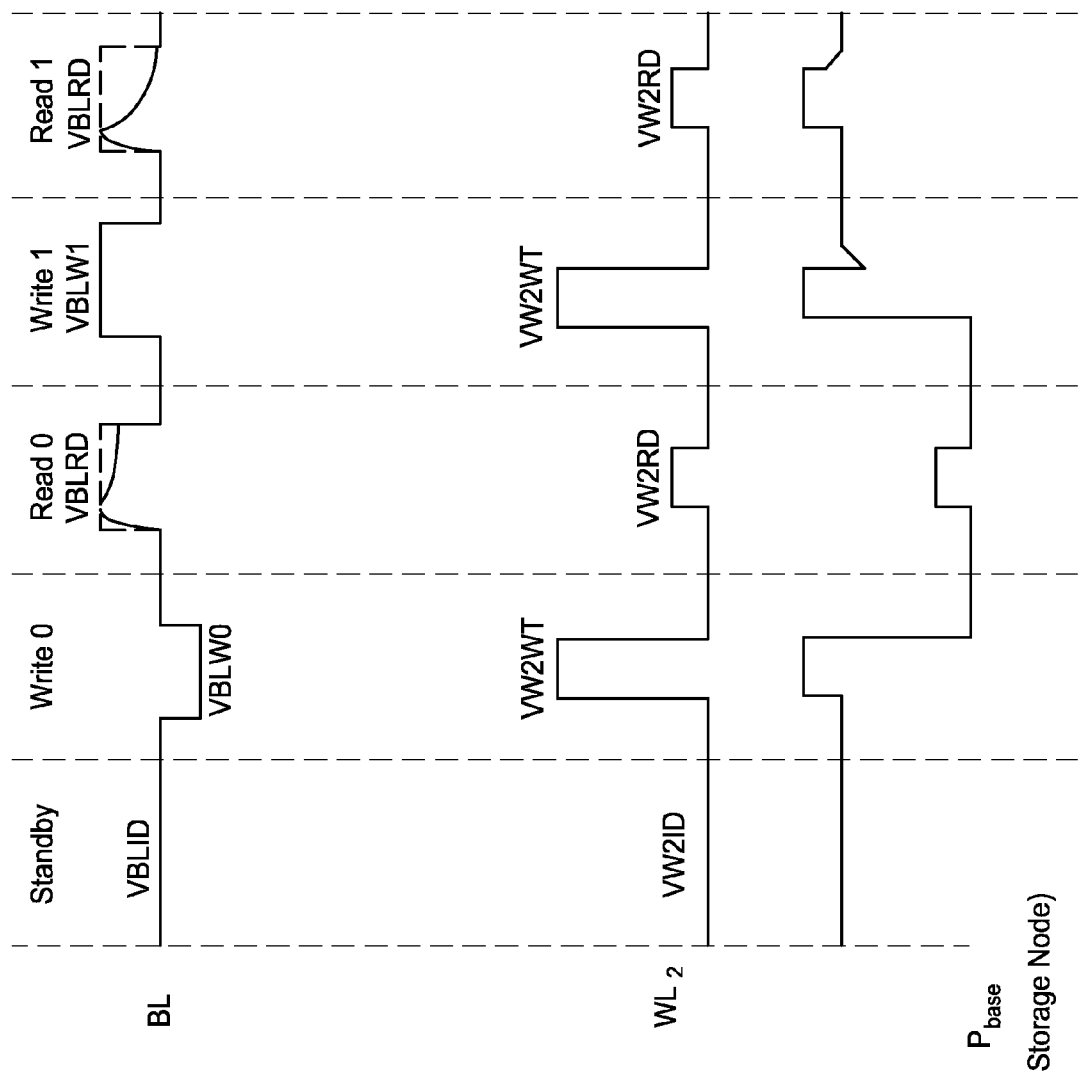
FIG. 6 diagrammatically illustrates an example embodiment operational arrangement for utilizing the memory array of FIG. 5.
Figure 7:
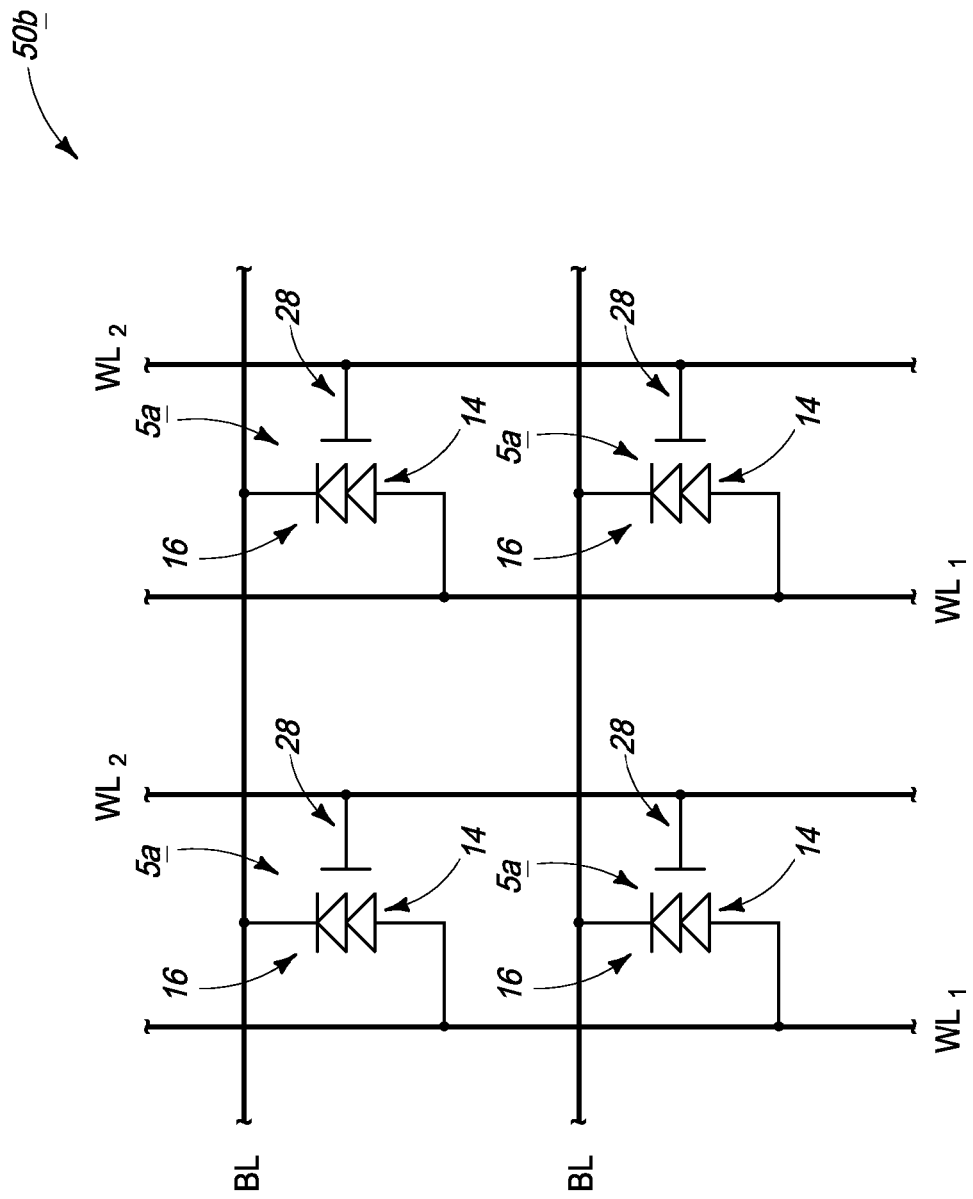
FIG. 7 is a diagrammatic schematic view of an example embodiment memory array comprising memory cells of the type shown in FIG. 2.

FIG. 6 diagrammatically illustrates various operations that may be utilized for programming individual memory cells of the array 50a into a "0" data state (i.e., "write 0" operations), programming the individual memory cells into a "1" data state (i.e., "write 1" operations), and for reading the memory cells to ascertain the data states of the individual memory cells. FIG. 6 also diagrammatically illustrates charge stored on the $P_{base}$ (i.e., the base 10 of FIG. 1) during the various operations. Example voltage levels for the various states indicated in FIG. 6 may include (assuming a bandgap of 2.3 V):
VBLID=0V
VBLW0=0V
VBLRD=3.2V (D0, 3.2V; D1, 2.5V)
VBLW1=3V
VW2ID=−3V
VW2WT=2V
VW2RD=−1.4V FIG. 7 diagrammatically illustrates another example embodiment memory array 50b. The memory array of FIG. 7 comprises a plurality of memory cells 5a of the type described above with reference to FIG. 2. The memory array of FIG. 7, like that of FIG. 3, comprises a series of bitlines (the series identified as BL), a first series of wordlines (the series identified as $WL_1$), and a second series of wordlines (the series identified as $WL_2$). In the shown embodiment, the electrode 14 of FIG. 2 corresponds to an anode and the electrode 16 corresponds to a cathode. The cathodes are coupled to bitlines (BL); and thus the nodes 20 of FIG. 2 may correspond to bitlines. The anodes are coupled to wordlines of the first series ($WL_1$); and thus the nodes 18 of FIG. 2 may correspond to wordlines of the first series. Gates analogous to the gate 28 of FIG. 2 are along wordlines of the second series ($WL_2$). Each memory cell of array 50b may be uniquely addressed through combinations containing one of the bitlines together with one of the wordlines $WL_2$ and/or one of the wordlines $WL_1$.

Figure 8:
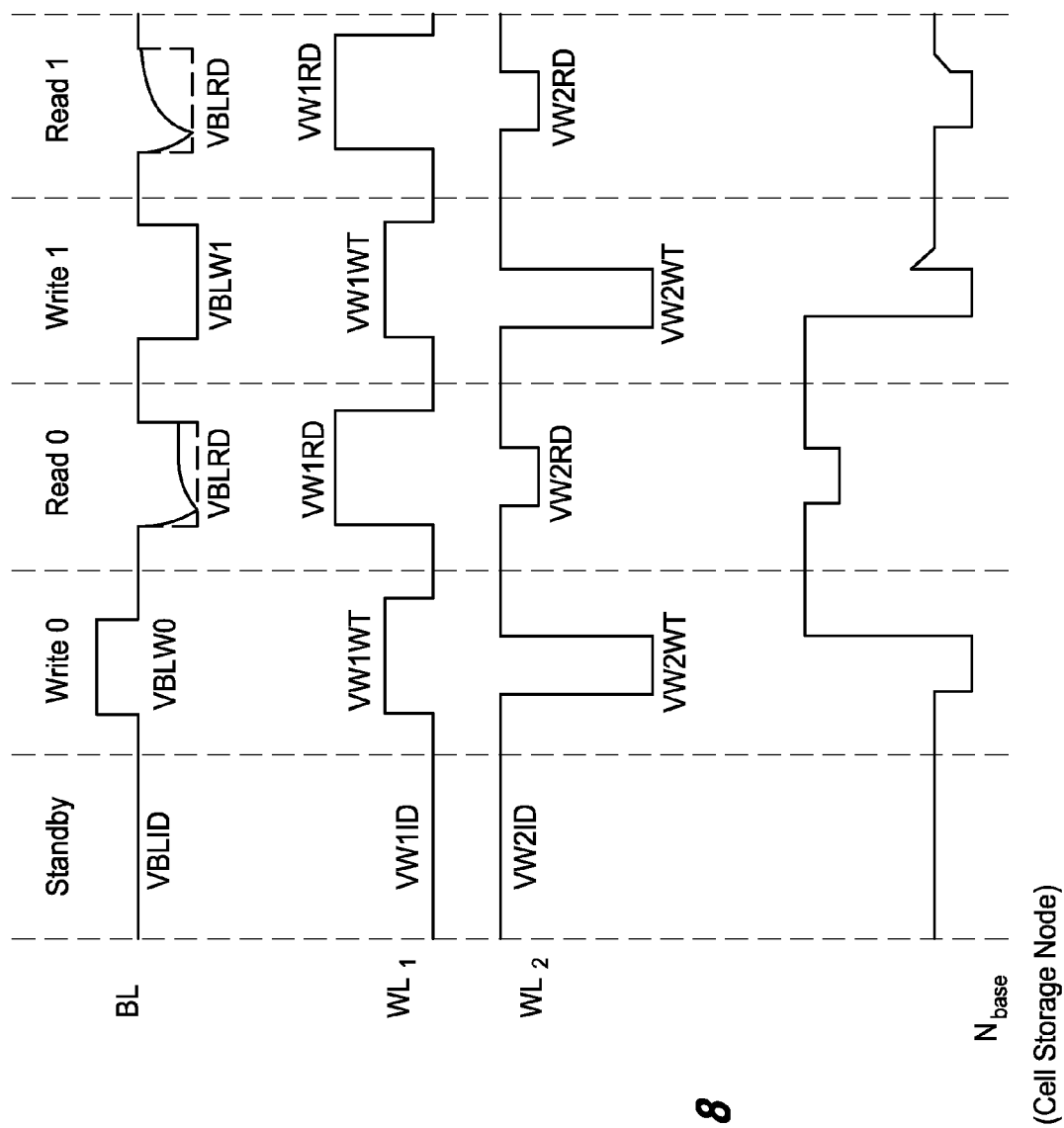
FIG. 8 diagrammatically illustrates an example embodiment operational arrangement for utilizing the memory array of FIG. 7.
Figure 9:
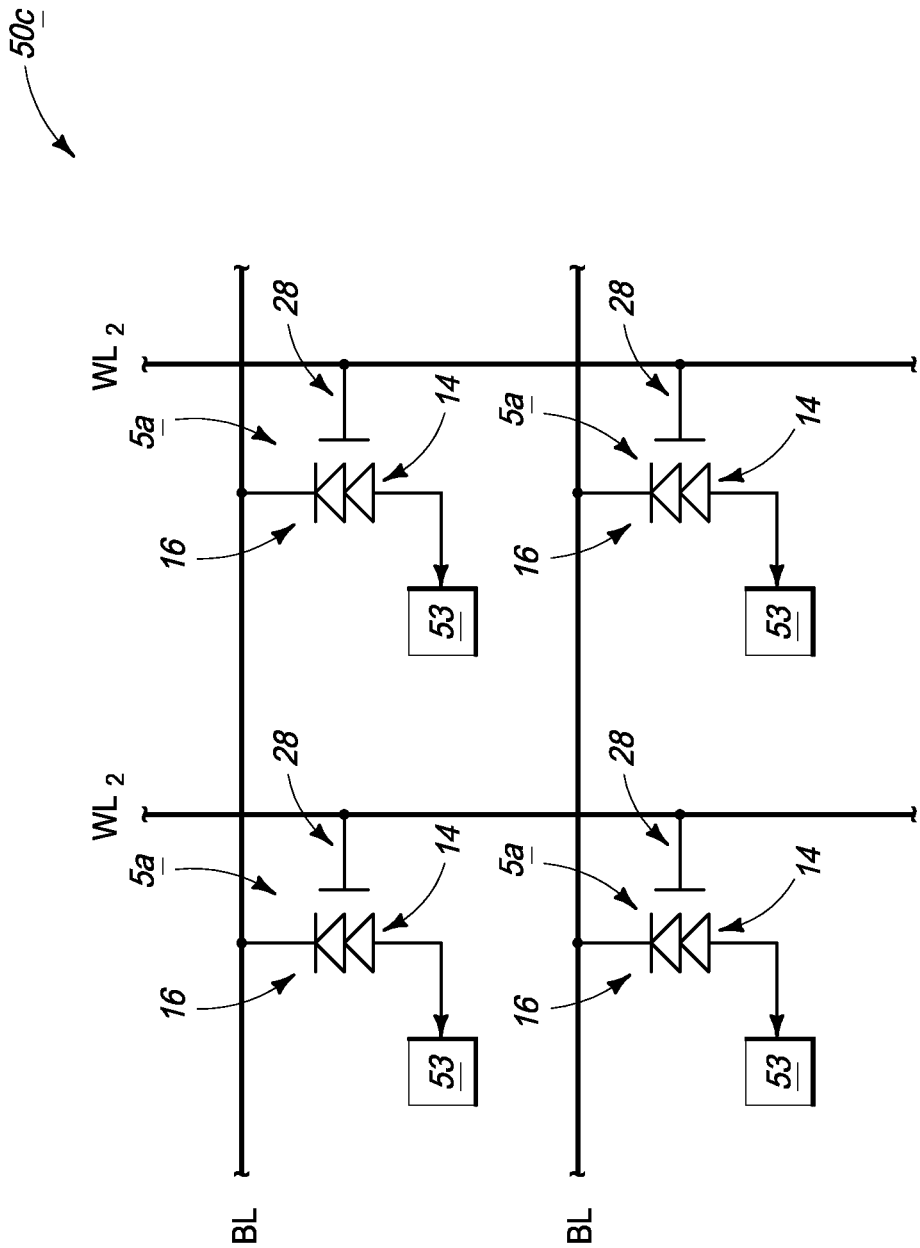
FIG. 9 is a diagrammatic schematic view of another example embodiment memory array comprising memory cells of the type shown in FIG. 2.

FIG. 8 diagrammatically illustrates various operations that may be utilized for programming individual memory cells of the array 50b into a "0" data state (i.e., "write 0" operations), programming the individual memory cells into a "1" data state (i.e., "write 1" operations), and for reading the memory cells to ascertain the data states of the individual memory cells. FIG. 8 also diagrammatically illustrates charge stored on the $N_{base}$ (i.e., the base 10 of FIG. 2) during the various operations. Example voltage levels for the various states indicated in FIG. 8 may include (assuming a bandgap of 2.3 eV):
VBLID=1.5V
VBLW0=2.2V
VBLRD=0V (D0, 0V; D1, 1V)
VBLW1=0.6V
VW1ID=1.5V
VW1WT=3V
VW1RD=3V
VW2ID=5V
VW2WT=0V
VW2RD=3.4V Another set of example voltage levels for the various states indicated in FIG. 8 may include (assuming a bandgap of 2.3 eV):
VBLID=1.5V
VBLW0=1.6V
VBLRD=0V (D0, 0V; D1, 1V)
VBLW1=0V
VW1ID=1.5V
VW1WT=2.4V
VW1RD=3V
VW2ID=5V
VW2WT=0V
VW2RD=3.4V FIG. 9 diagrammatically illustrates another example embodiment memory array 50c comprising a plurality of memory cells 5a of the type described above with reference to FIG. 2. The memory array of FIG. 9 is similar to that of FIG. 7, except that the first series of wordlines ($WL_1$ of FIG. 7) have been replaced with nodes 53. The nodes 53 are at a common voltage as one another, and in some embodiments may be electrically coupled with one another and with a common terminal (for instance, they may all be connected to a plate having a voltage of 3V).

Figure 10:
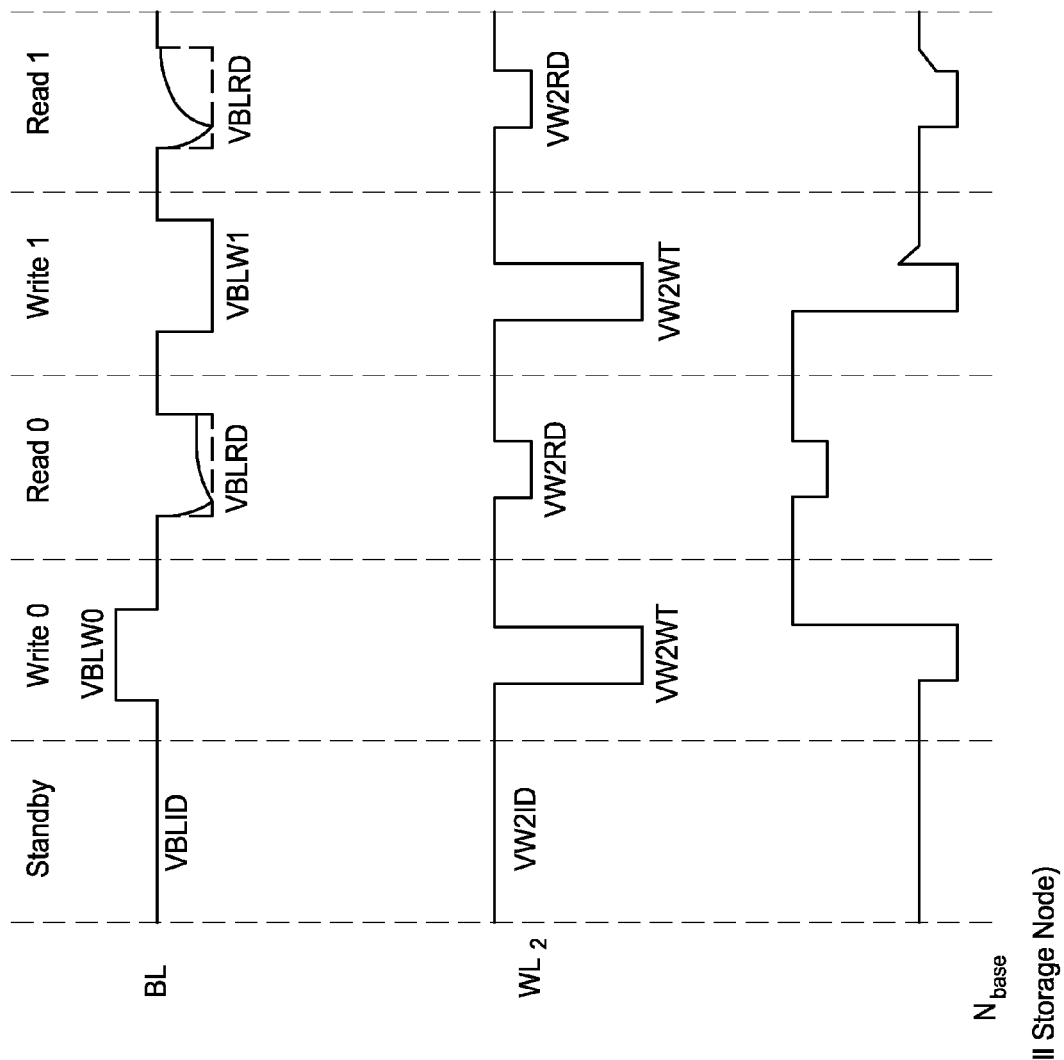
FIG. 10 diagrammatically illustrates an example embodiment operational arrangement for utilizing the memory array of FIG. 9.
Figure 12:
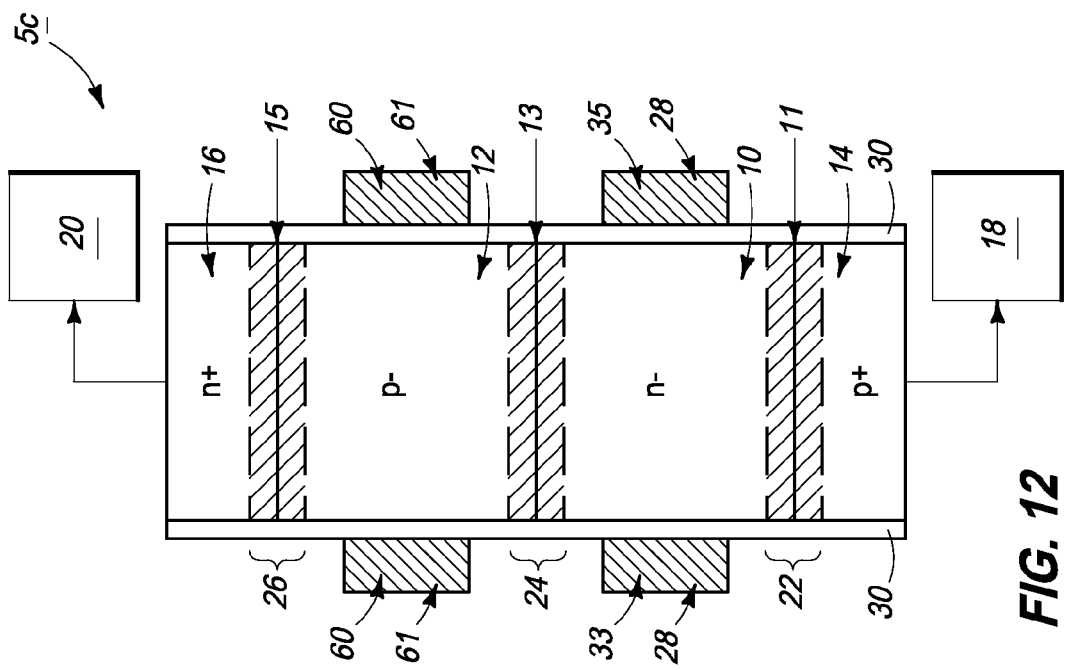
FIG. 12 is a diagrammatic cross-sectional view of another example embodiment memory cell.
Figure 11:
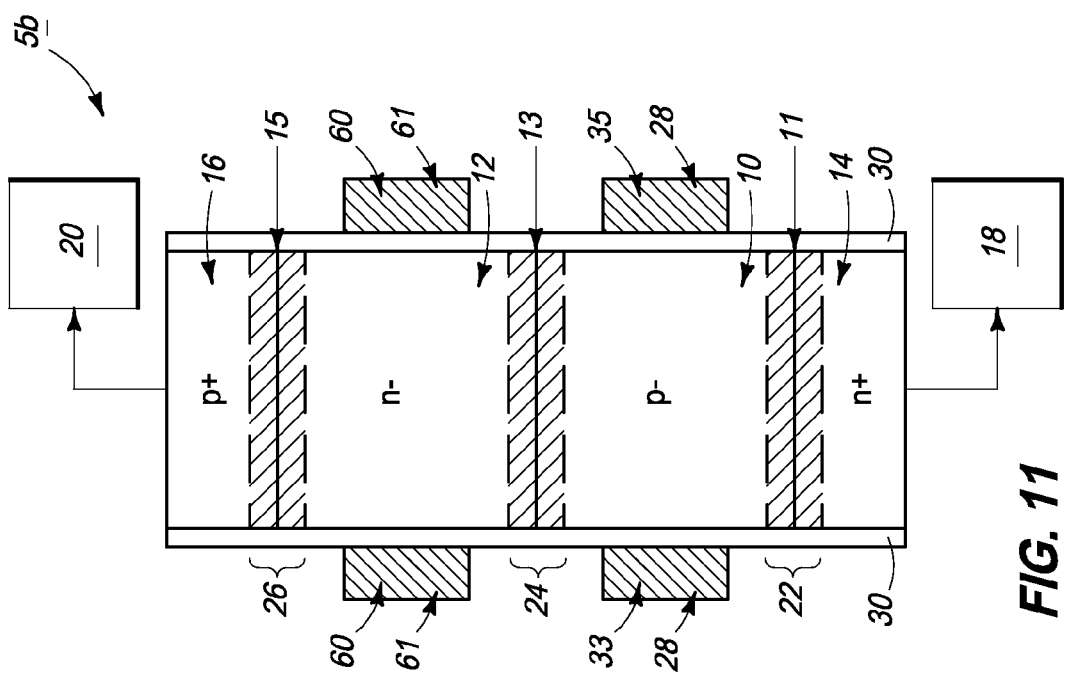
FIG. 11 is a diagrammatic cross-sectional view of another example embodiment memory cell.

FIG. 10 diagrammatically illustrates various operations that may be utilized for programming individual memory cells of the array 50c into a "0" data state (i.e., "write 0" operations), programming the individual memory cells into a "1" data state (i.e., "write 1" operations), and for reading the memory cells to ascertain the data states of the individual memory cells. FIG. 10 also diagrammatically illustrates charge stored on the $N_{base}$ (i.e., the base 10 of FIG. 2) during the various operations. Example voltage levels for the various states indicated in FIG. 10 may include (assuming a bandgap of 2.3 eV):
VBLID=2.2V
VBLW0=2.2V
VBLRD=0V (D0, 0V; D1, 1V)
VBLW1=0V
VW2ID=4V
VW2WT=0V
VW2RD=2V The memory cells of FIGS. 1 and 2 have a gate (28) along only one of the base regions of the thyristor (specifically, the base region 10 in the shown embodiments). FIGS. 11 and 12 illustrate alternative embodiments in which paired gates are utilized so that each of the base regions of the thyristor is coupled with a gate.

Referring to FIG. 11, such illustrates a memory cell 5b analogous to the memory cell 5 of FIG. 1, but comprising a second gate 60 which is coupled with base region 12. The second gate 60 is shown to be bifurcated into a pair of segments 61 and 63 along the cross-sectional view of FIG. 11, but such segments may join with one another at some location outside of the view of FIG. 11 so that the segments are actually two parts of the same gate. In some embodiments, the second gate 60 may extend entirely around the base region 12 (a so-called gate all around construction) so that the gate is along sides of the base region 12 that are in and out of the page relative to the view of FIG. 11, and in some embodiments the gate may be only along the opposing sides of the base region 12 shown in FIG. 11.

The illustrated memory cell 5b may be considered to comprise a thyristor pillar, and to comprise a two-to-one relationship of gates with the pillar. Specifically, the gates are a pair of vertically-spaced gates 28 and 60; with one of the gates being coupled with the n-type base region 12 of the thyristor, and the other of the gates being coupled with the p-type base region 10 of the thyristor.

The gate 60 may comprise any suitable material, and may, for example, comprise one or more of the materials discussed above as being suitable for utilization in gate 28.

The gate 60 does not overlap the junctions 13 and 15 on opposing sides of base region 12, and in the shown embodiment the gate 60 also does not overlap the depletion regions 24 and 26 during operation of the thyristor. In the shown configuration, the gate 60 may be considered to vertically overlap the base region 12, and to not vertically overlap the depletion regions 24 and 26.

It can be advantageous for gate 60 to not overlap depletion regions 24 and 26 for reasons analogous to those discussed above as advantages for having the gate 28 not overlap depletion regions 22 and 24. Specifically, if gate 60 does not overlap depletion regions 24 and 26 such can alleviate or eliminate gate-induced leakage from gate 60.

The utilization of two gated base regions within the memory cell 5b may provide additional operational parameters within the memory cell (as described below with reference to FIGS. 14-17) which may enable the memory cell to be more readily tailored for some applications than could a memory cell having only a single gated base region.

The incorporation of a second gate into a memory cell may be utilized with any thyristor-based memory cell. Although FIG. 11 shows the second gate utilized with a pnpn thyristor, in other embodiments the second gate could also be utilized with an npnp thyristor. For instance, FIG. 12 shows a memory cell 5c comprising an npnp thyristor having two gated base regions.

Figure 13:
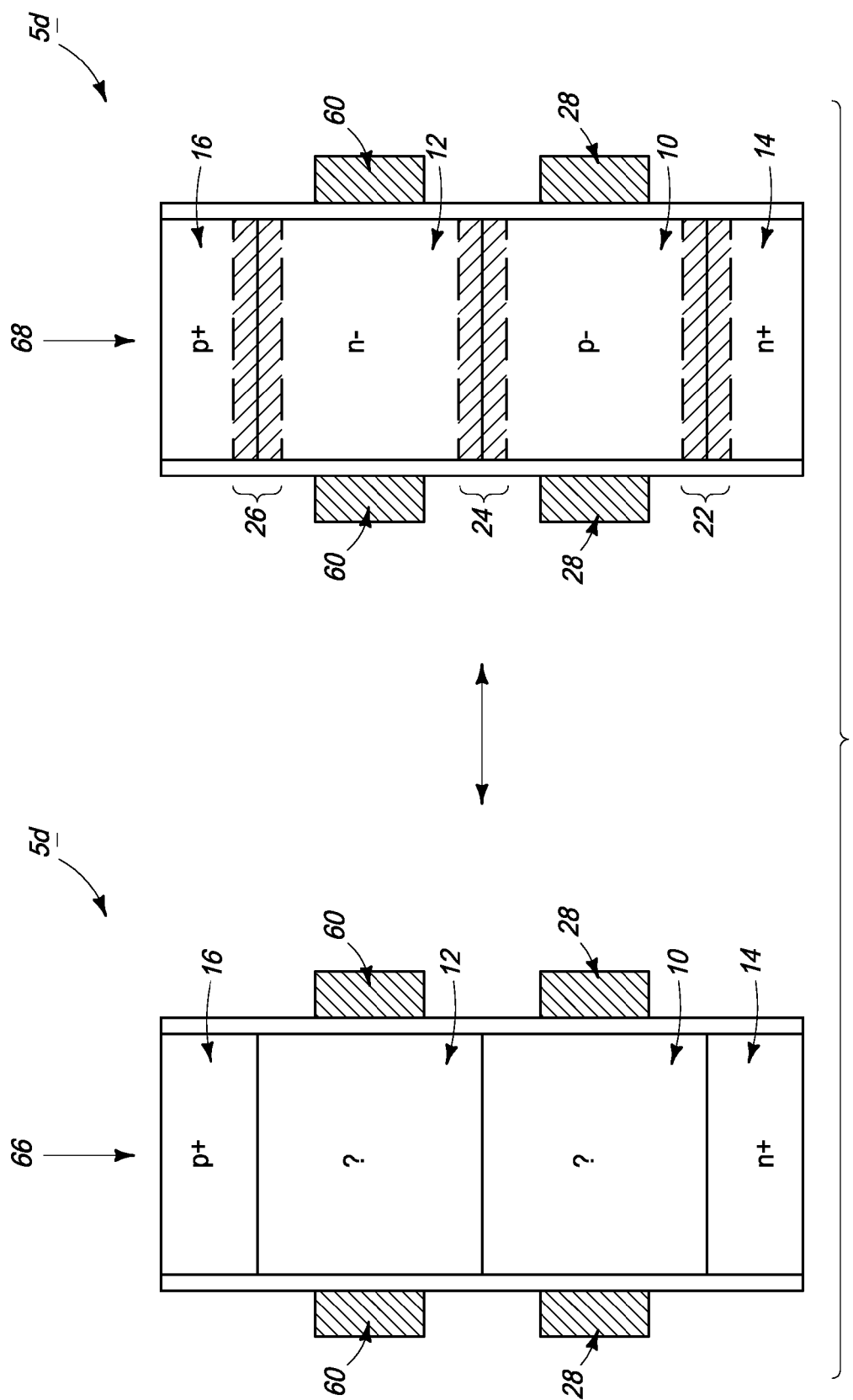
FIG. 13 illustrates an example embodiment memory cell in two different modes.

The memory cells of FIGS. 1, 2, 11 and 12 are shown to comprise doped base regions. A difficulty that may occur in utilizing wide-bandgap materials is that it may be difficult to attain desired dopant levels in the base regions. Accordingly, the gate adjacent to a gated base region may be utilized to induce a desired conductivity type within the base region in some embodiments. For instance, the gates 28 of FIGS. 1 and 2 may be utilized to induce a desired conductivity type within base region 10; or one or both of the gates 28 and 60 of FIGS. 11 and 12 may be utilized to induce desired conductivity types within one or both of the base regions 10 and 12. FIG. 13 shows a memory cell 5d being shifted between two different modes by utilizing gates 28 and 60 to induce desired conductivity types within base regions 10 and 12.

The memory cell 5d of FIG. 13 has an initial mode 66 in which base regions 10 and 12 are of unspecified dopant type. The dopant type within the regions may be unknown, or may be different than a dopant type desired in a working thyristor. For instance, base region 10 should be p-type in a working thyristor, but may be n-type in mode 66, or may be of an undetermined type, depending on, among other things, the processing conditions utilized to form region 10 and the composition of region 10.

The initial mode 66 is converted to a different mode 68 through application of electric fields onto base regions 10 and 12 utilizing gates 28 and 60. The transition from mode 66 to mode 68 may be considered to comprise electrical inducement of desired dopant types within the base regions 10 and 12. The mode 68 has regions 10 and 12 appropriately doped for the pnpn the thyristor, and specifically has region 12 doped to n-type and region 10 doped to p-type. In the shown embodiment, the mode 68 also has depletion regions 22, 24 and 26 formed within the thyristor. The operation of the thyristor may further include inducement of a memory state within the thyristor through utilization of a voltage differential between the two electrode regions (14 and 16), together with capacitive coupling of one both of the base regions (10 and 12) to the gate adjacent the base region (gates 28 and 60).

In the shown embodiment, both of gates 28 and 60 are utilized for electrical inducement of desired dopant types the base regions (10 and 12), and are utilized for operation of the thyristor. In other embodiments, one of the gates may be utilized only for either electrical inducement or operation of the thyristor, rather than being utilized for both tasks.

In some embodiments, the vertical thyristor pillar 5d at the initial mode 66 may be considered to correspond to a structure having two electrodes (regions 14 and 16), and having a segment between the two electrodes (with the segment comprising the base regions 10 and 12). The segment has at least one gated portion (i.e., a portion proximate a gate), and in the shown embodiment of FIG. 13 has two gated portions. The thyristor pillar may be considered to be transitioned from mode 66 to mode 68 by inducing a conductivity type within the gated portion utilizing an electrical field produced with the gate.

In some embodiments, the thyristor 5d of FIG. 13 will comprise wide-bandgap material at least within one or both of the base regions 10 and 12. Such wide-bandgap material may extend entirely across depletion regions 22, 24 and 26 to reduce junction leakage, and to thereby increase retention time of the thyristor relative to a thyristor lacking the wide-bandgap material.

Although the inducement of conductivity type within the base regions may be particularly advantageous when utilizing wide-bandgap materials in the base regions, there may also be advantages to such inducement when the base regions comprise, consist essentially of, or consist of conventional semiconductor materials (like silicon). Accordingly, in some embodiments gates analogous to one or both of the gates 28 and 60 may be utilized to induce conductivity type in one or both base regions of a thyristor that has conventional semiconductor materials in one or both of such base regions.

Figure 14:
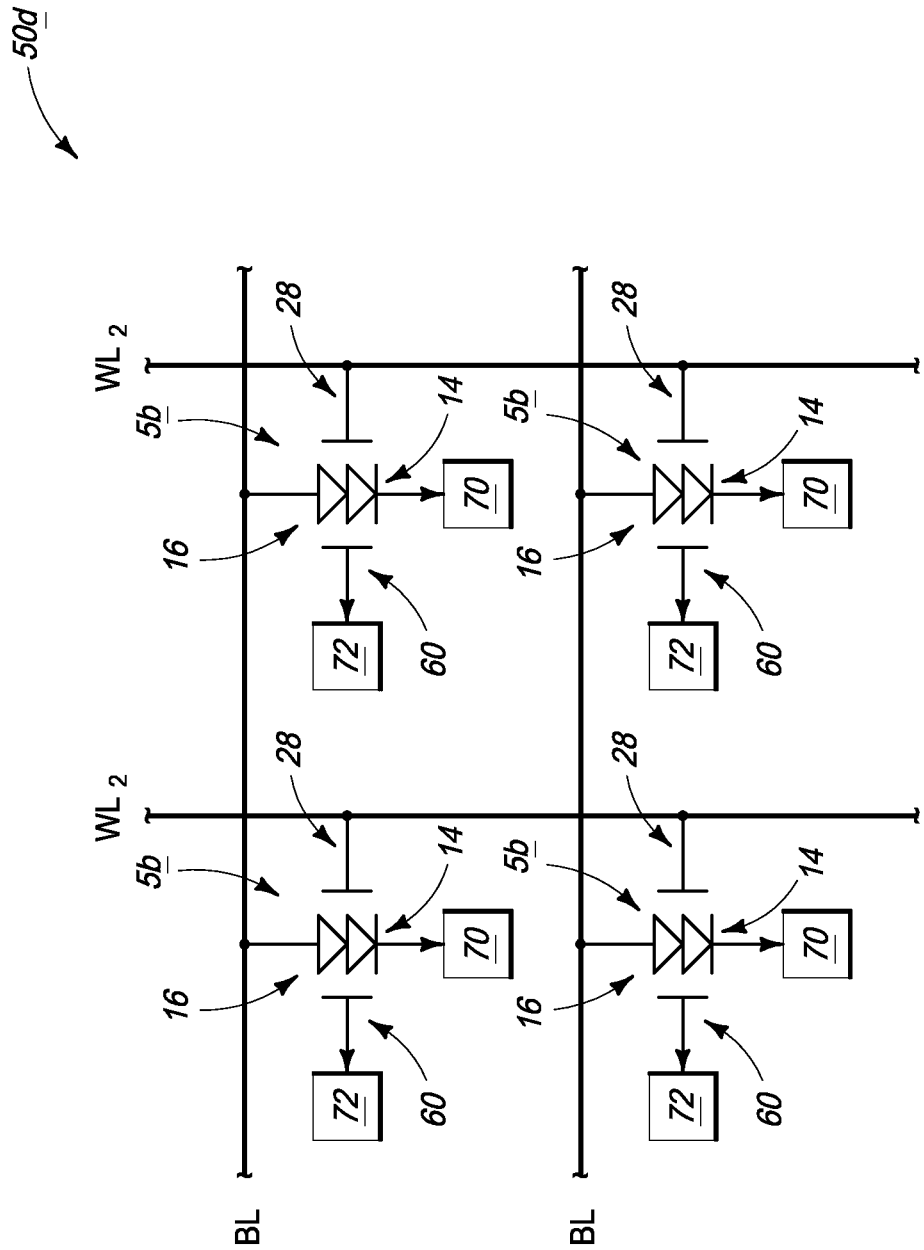
FIG. 14 is a diagrammatic schematic view of an example embodiment memory array comprising memory cells of the type shown in FIG. 11.

The memory cells of FIGS. 11-13 may be incorporated into memory arrays. FIG. 14 diagrammatically illustrates an example embodiment memory array 50d utilizing a plurality of memory cells 5b of the type shown in FIG. 11. The memory array 50d comprises a series of bitlines (BL) connected to the anodes 16 of the thyristors, a series of wordlines (identified as $WL_2$) connected to the gates 28, a series of first nodes 70 connected to the cathode regions of the thyristors, and a second series of nodes 72 connected to the gates 60. The nodes 70 may be all at a common voltage as one another, and the nodes 72 may be all at a common voltage as one another.

Figure 15:
FIG. 15 diagrammatically illustrates an example embodiment operational arrangement for utilizing the memory array of FIG. 14.

FIG. 15 diagrammatically illustrates various operations that may be utilized for programming individual memory cells of the array 50d into a "0" data state (i.e., "write 0" operations), programming the individual memory cells into a "1" data state (i.e., "write 1" operations), and for reading the memory cells to ascertain the data states of the individual memory cells. FIG. 15 also diagrammatically illustrates charge stored on the $P_{base}$ (i.e., the base 10 of FIG. 11) during the various operations. Example voltage levels for the various states indicated in FIG. 15 may include (assuming a bandgap of 2.3 eV, assuming nodes 70 are at about 0V, and assuming nodes 72 are at about 3V):

VBLID=0.8V
VBLW0=0.8V
VBLRD=3V (D0, 3V; D1, 2V)
VBLW1=2.9V
VW2ID=−3V
VW2WT=2V
VW2RD=−1.4V

Voltage levels analogous to those of FIG. 15 may be utilized for the memory cell of FIG. 12 (which has an n-type base 10), if the nodes 72 (FIG. 14) are at about −3V.

Figure 16:
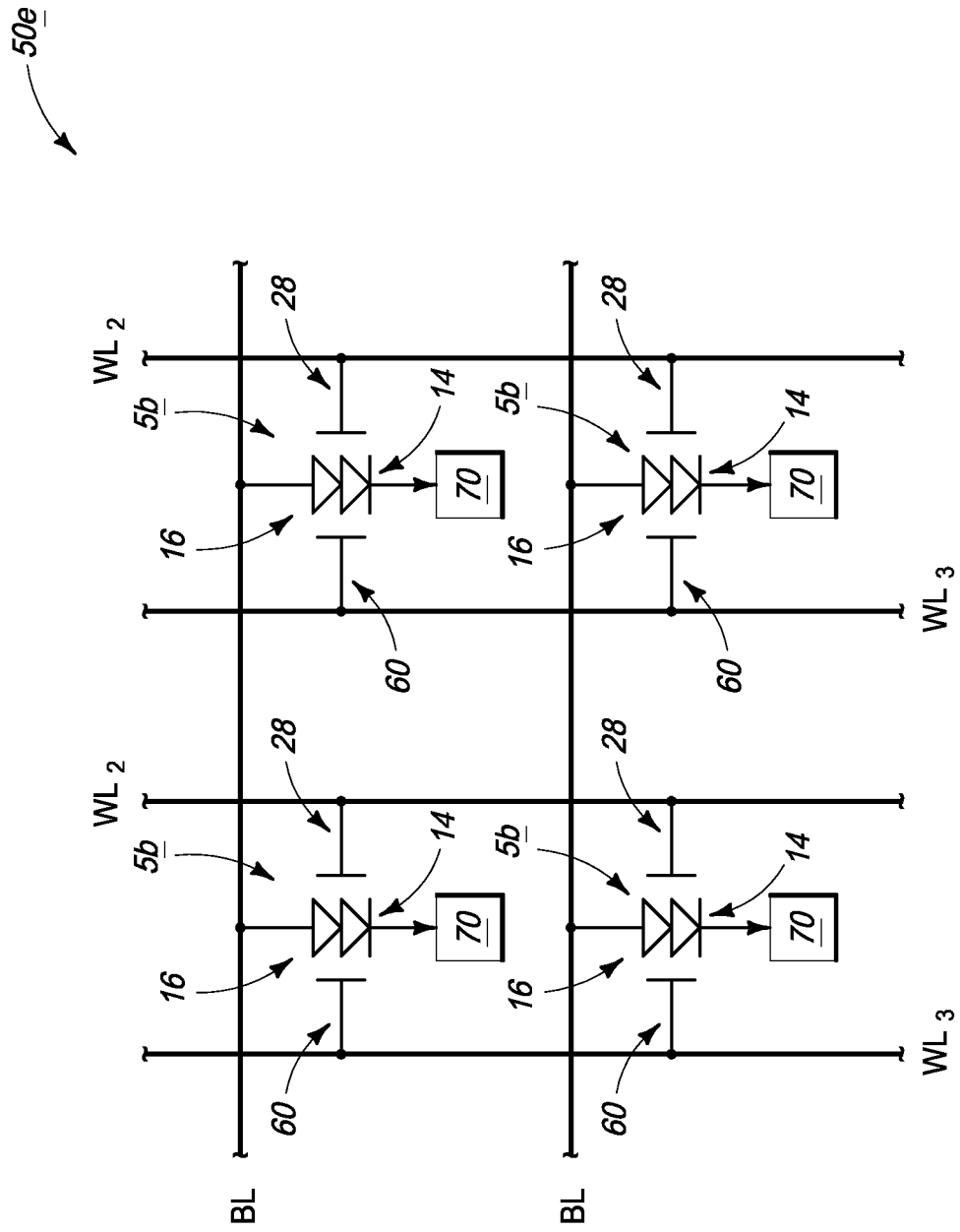
FIG. 16 is a diagrammatic schematic view of another example embodiment memory array comprising memory cells of the type shown in FIG. 11.

The memory array of FIGS. 14 and 15 has the gates 60 held at about a constant voltage across all of the memory cells during read and write operations. In other memory arrays, the voltages across the gates 60 may vary, together with the voltages across gates 28, during the reading and writing operations. FIG. 16 illustrates a memory array 50e in which the gates 28 and 60 are both configured to be varied during reading and writing operations. The memory array 50e of FIG. 16 is similar to the memory array 50d of FIG.

14, except that gates 60 are connected to a set of wordlines (WL$_3$) instead of being connected to static voltage nodes.

Figure 17:
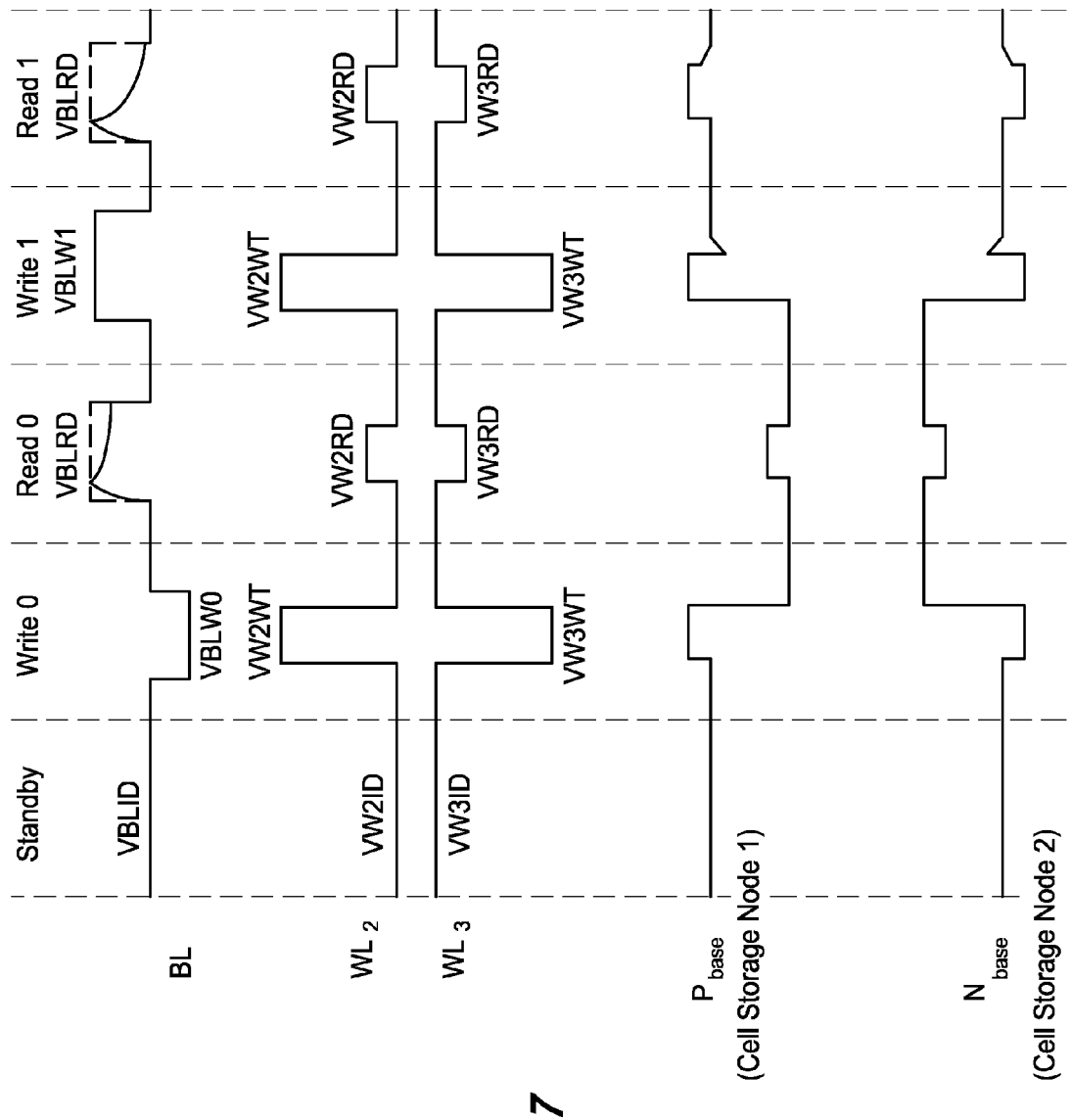
FIG. 17 diagrammatically illustrates an example embodiment operational arrangement for utilizing the memory array of FIG. 16.

FIG. 17 diagrammatically illustrates various operations that may be utilized for programming individual memory cells of the array 50e into a "0" data state (i.e., "write 0" operations), programming the individual memory cells into a "1" data state (i.e., "write 1" operations), and for reading the memory cells to ascertain the data states of the individual memory cells. FIG. 17 also diagrammatically illustrates charges stored on the P$_{base}$ (i.e., the base 10 of FIG. 11) and the N$_{base}$ (i.e., the base 12 of FIG. 11) during the various operations. Example voltage levels for the various states indicated in FIG. 17 may include (assuming a bandgap of 2.3 eV, and assuming nodes 70 are at about 0V):

VBLID=0.8V
VBLW0=0.8V
VBLRD=3V (D0, 3V; D1, 2V)
VBLW1=3V
VW2ID=−3V
VW2WT=0V
VW2RD=−1.4V
VW3ID=3V
VW3WT=0V
VW3RD=1.4V

The various memory cells and memory arrays of FIGS. 1-17 may be formed utilizing any suitable processing. For instance, FIGS. 18 and 19 illustrate an example process for fabricating a memory array 50a of the type shown in FIG. 5.

Figure 18:
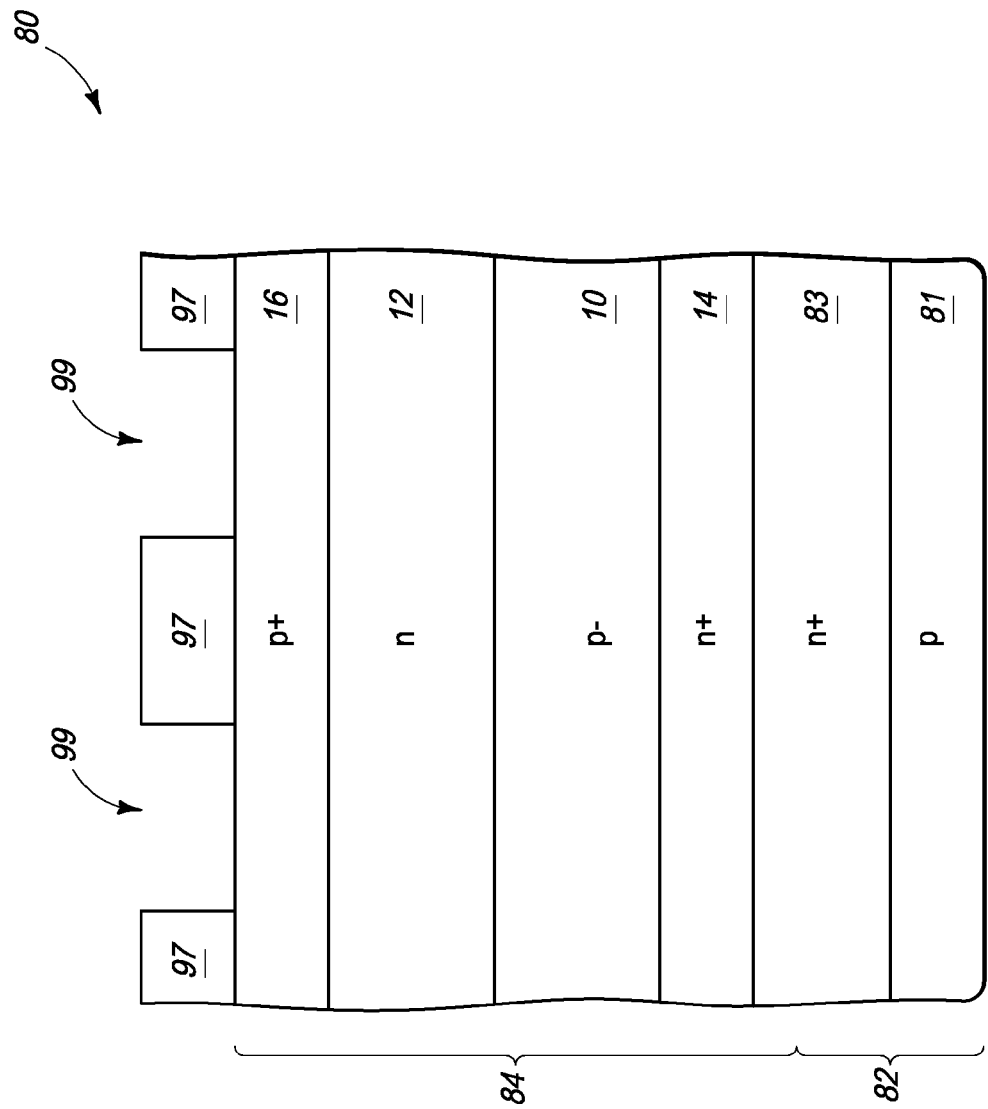
FIGS. 18 and 19 diagrammatically illustrate process stages of an example embodiment method for fabricating an array of memory cells.
Figure 19:
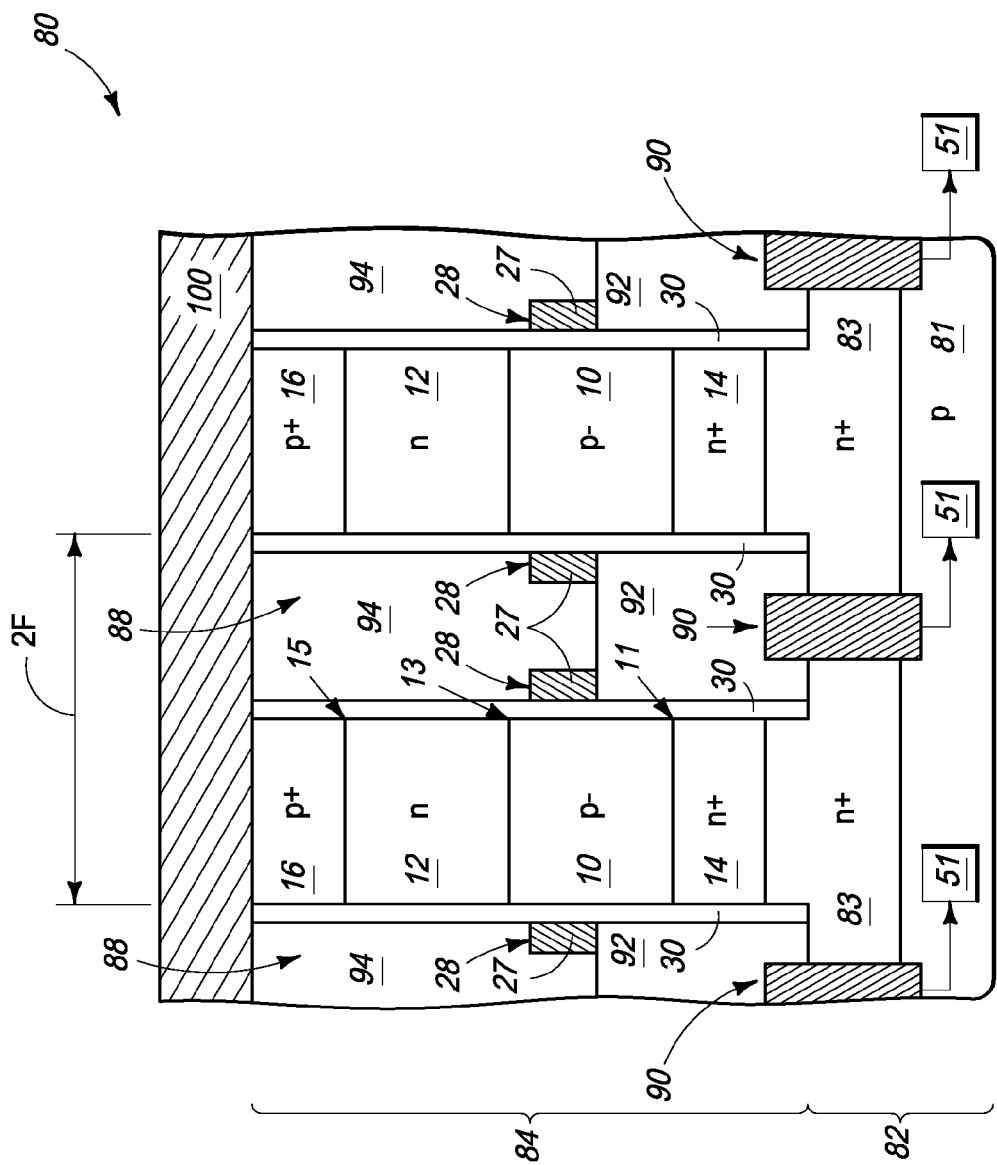

Referring to FIG. 18, a semiconductor construction 80 comprises a substrate 82 comprising an n-type doped region 83 over a p-type doped region 81. The substrate 82 may comprise, consist essentially of, or consist of monocrystalline silicon in some embodiments. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. The substrate may comprise numerous materials in some embodiments. For instance, the substrate may correspond to a semiconductor substrate containing one or more materials associated with integrated circuit fabrication. In such embodiments, such materials may correspond to one or more of refractory metal materials, barrier materials, diffusion materials, insulator materials, etc.

In some embodiments, the regions 81 and 83 may be conductively-doped regions of a monocrystalline silicon wafer, and/or may be conductively-doped regions formed along a tier of a partially-fabricated integrated circuit.

Conductively-doped regions 10, 12, 14 and 16 of a memory cell stack 84 are formed over substrate 82. In some embodiments, the entire stack 84 may comprise, consist essentially of, or consist of doped wide-bandgap material (such as, for example, 3C-SiC). If doped region 83 comprises monocrystalline silicon and the wide-bandgap material comprises silicon carbide, the wide-bandgap material may be epitaxially grown over the monocrystalline silicon.

A difficulty encountered in incorporating wide-bandgap materials (such as, for example, silicon carbide) into integrated circuit fabrication sequences is that dopant activation within the wide-bandgap materials may utilize a thermal budget which is too high for many of the components conventionally utilized in integrated circuitry. A method of reducing the thermal budget for dopant activation is to in situ dope the wide-bandgap material during epitaxial growth of such material.

A patterned mask 97 is formed over memory cell stack 84, with such patterned mask defining a pattern corresponding to a plurality of openings 99 that extend through the mask. The patterned mask may comprise any suitable composition and may be formed with any suitable processing. For instance, the mask may comprise photolithographically-patterned photoresist. As another example, the mask may comprise one or more structures formed utilizing pitch multiplication methodologies.

Referring to FIG. 19, a pattern is transferred from mask 97 (FIG. 18) into stack 84 with one or more suitable etches, and then the mask is removed. The memory cell stack 84 is thus patterned into a plurality of substantially vertical thyristor pillars 88 that extend upwardly from the substrate 82. Subsequently, dielectric material 30 is formed along sidewalls of the pillars.

The pillars 88 are referred to as being "substantially vertical" pillars to indicate that they extend substantially orthogonally to a primary upper surface of the substrate. Specifically, the term "vertical" is used herein to define a relative orientation of an element or structure with respect to a major plane or surface of a wafer or substrate. A structure may be referred to as being "substantially vertical" to indicate that the structure is vertical to within reasonable tolerances of fabrication and measurement.

Electrically-conductive interconnects 90 are formed between the pillars and in electrical connection with doped region 83. The interconnects 90 may be electrically coupled with one another through doped region 83 and/or through other interconnections, and may be all electrically connected to a common terminal so that they are all tied to the common voltage 51 (as shown).

The dielectric material 30 may be formed by initially providing surface passivation along outer exposed surfaces of pillars 88. Such surface passivation may comprise providing a layer containing silicon, oxygen and nitrogen along the outer surfaces. Such layer may be formed by nitridation/oxidation of exposed outer surfaces of silicon carbide in some embodiments, and/or by deposition of passivation material along the exposed outer surfaces. The dielectric material 30 may consist of the passivation layer in some embodiments. In other embodiments, additional dielectric materials may be formed over the passivation layer to form a dielectric material 30 comprising the passivation layer in combination with other dielectric materials. Such other dielectric materials may comprise, for example, one or both of silicon dioxide and silicon nitride.

In some embodiments, material 90 may comprise metal or other thermally sensitive material, and an advantage of forming conductive material 90 after the doping of the wide-bandgap material is that such can avoid exposure of the thermally sensitive material to the thermal budget utilized for the doping of the wide-bandgap material.

Electrically insulative material 92 is formed over conductive material 90 and between the pillars 88, and then the conductive material 27 is formed and patterned over insulative material 92 to form the gates 28. Subsequently, another insulative material 94 is formed over gates 28 and insulative material 92. The electrically insulative materials 92 and 94 may comprise any suitable compositions or combinations of compositions, including, for example, one or more of silicon dioxide, silicon nitride, and any of various doped oxide glasses (for instance, borophosphosilicate glass, phosphosilicate glass, fluorosilicate glass, etc.). The electrically insulative materials 92 and 94 may be the same composition as one another in some embodiments, and may differ in composition from one another in other embodiments.

A bitline 100 is formed across the pillars 88, and in direct electrical contact with the upper doped regions 16 within such pillars. The bitline 100 may be considered to be an example of a node 20 (FIG. 1) that may be formed in direct electrical connection with the upper electrode regions 16 of the illustrated example embodiment memory cells. Bitline 100 may comprise any suitable electrically conductive material; and may, for example, comprise, consist essentially of, or consist of one or more of various metals, metal-containing compositions and conductively-doped semiconductor materials.

The construction 80 has a dimension from one side of a pillar to a same side of an adjacent pillar of 2F, and thus the individual memory cells may have footprints of about $4F^2$.

The thyristor pillars 88 have topmost junctions corresponding to the junctions 15 between regions 12 and 16. In some embodiments, it may be desired to utilize a so-called top junction lifetime killer implant to reduce carrier lifetime across such top junction and improve junction breakdown voltage. Any suitable species may be implanted for the top junction lifetime killer implant, and the species may vary depending on the materials present in regions 12 and 16. In some embodiments, a suitable species for the top junction lifetime killer implant may be carbon.

Although the top junction killer implant is described specifically with reference to the embodiment of FIGS. 18 and 19, it is to be understood that the top junction lifetime killer implant may be utilized in any of the various embodiments described in this disclosure.

Although FIGS. 18 and 19 pertain to formation of memory cells of the type shown as memory cells 5 in FIG. 1, persons of ordinary skill will recognize that similar processing may be utilized to form any of the other memory cells described in this disclosure. For instance, in some embodiments, processing analogous to that of FIGS. 18 and 19 may be utilized to fabricate two-gate thyristors of the types described with reference to FIGS. 11-13.

The embodiment of FIGS. 18 and 19 patterns the thyristor pillars 88 (FIG. 19) by providing a patterned mask (97 of FIG. 18) over an expanse of memory cell material, and then transferring a pattern from the mask into the memory cell material with one or more suitable etches. Another example embodiment method for forming the pillars may comprise depositing the memory cell material within a plurality of openings, as described with reference to FIGS. 20-22.

Figure 20:
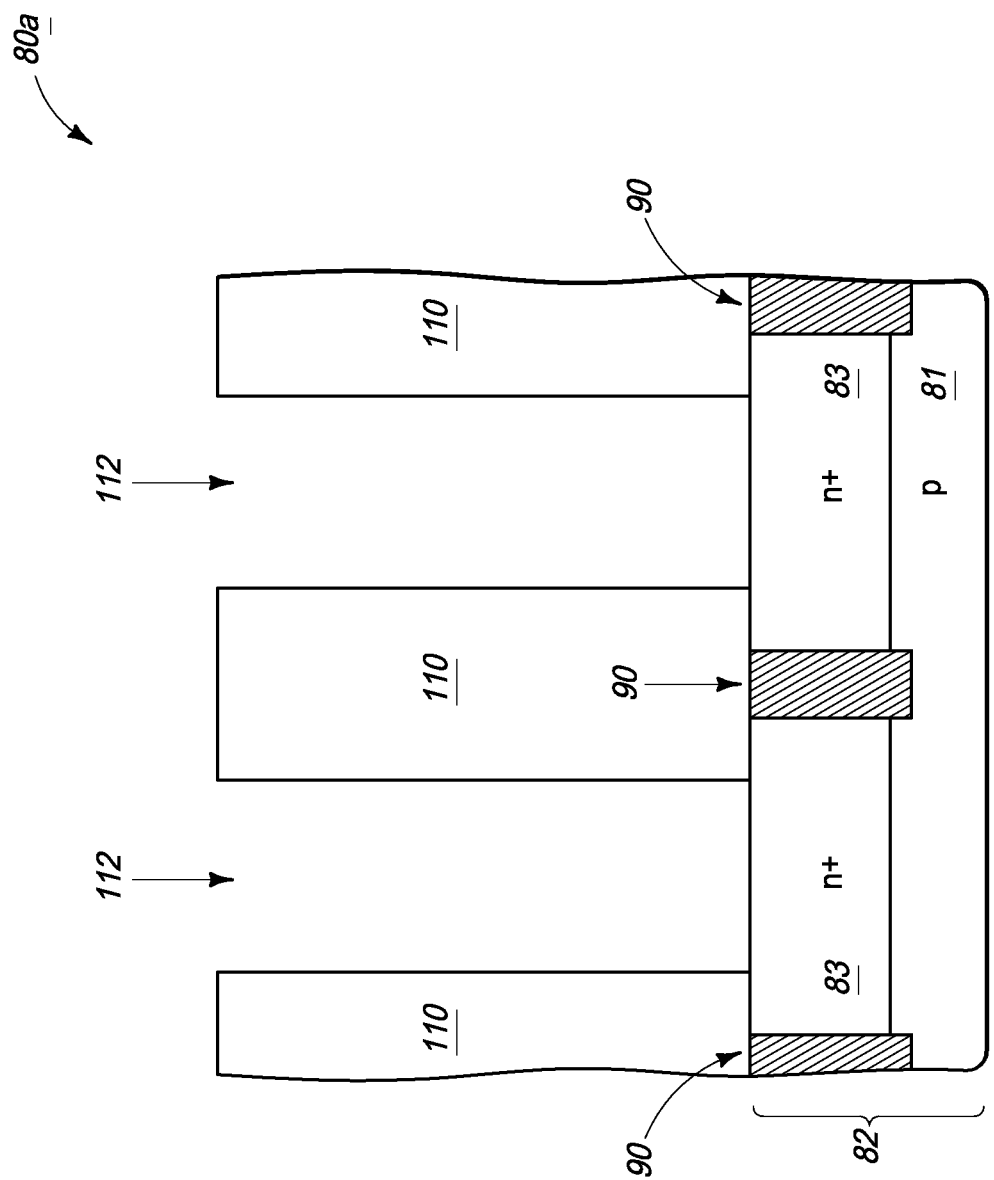
FIGS. 20-22 diagrammatically illustrate process stages of another example embodiment method for fabricating an array of memory cells.

Referring to FIG. 20, a construction 80a comprises the substrate 82 and a patterned dielectric material 110 formed over the substrate. The dielectric material 110 may comprise any suitable composition or combination of compositions; and in some embodiments may comprise, consist essentially of, or consist of one or more of silicon dioxide, silicon nitride, and any of various doped silicon oxide glasses (for instance, borophosphosilicate glass, phosphosilicate glass, etc.). The patterned dielectric material has a plurality of vertical openings 112 extending therethrough, with such openings being arranged in a pattern across the substrate. The openings may be formed utilizing any suitable processing, such as, for example, formation of a patterned mask (not shown) over the dielectric material 110 to define locations for the openings, followed by one or more suitable etches through material 110 to create the openings. The patterned mask may be any suitable mask, including, for example, a photolithographically-patterned photoresist mask, and/or a mask created utilizing various pitch multiplication methodologies.

The substrate 80 of FIG. 20 has the electrically-conductive interconnects 90 formed therein. In subsequent processing (described below with reference to FIGS. 21 and 22), wide-bandgap material will be formed within openings 112 and conductively doped. As discussed above with reference to FIGS. 18 and 19, the conductive doping of wide-bandgap material may comprise a thermal budget which can problematically affect common conductive materials (for instance, metal) utilized for conductive interconnects. However, in some embodiments, either conductive interconnects 90 may be formed of material that tolerates the relatively high thermal budget utilized for fabricating doped wide-bandgap materials, or the wide-bandgap material may be of a composition that can be formed and conductively-doped within a thermal budget that does not adversely impact conductive interconnects formed of conventional materials. Accordingly, there can be embodiments in which the conductive interconnects 90 are formed prior to fabrication and doping of wide-bandgap materials. If there may be a problem in forming the conductive interconnects prior to the fabrication and doping of the wide-bandgap materials, the conductive interconnects may be alternatively formed after fabrication and doping of the thyristor pillars with processing analogous to that discussed above with reference to FIG. 19.

Figure 21:
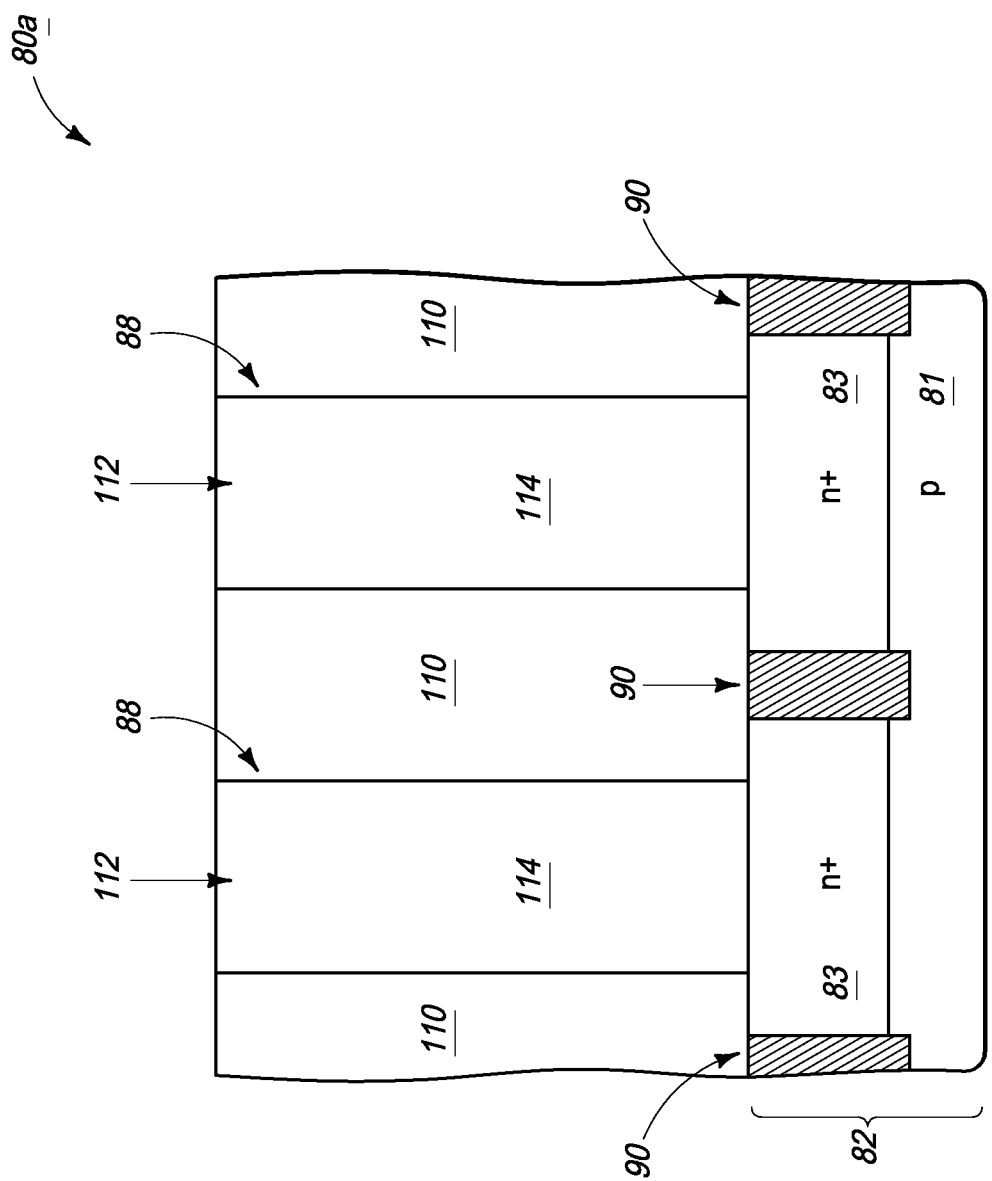

Referring to FIG. 21, thyristor pillar material 114 is formed within openings 112. The thyristor pillar material may comprise wide-bandgap material, such as, for example, one or more forms of silicon carbide (with an example form of silicon carbide being 3C-SiC). Although the thyristor pillar material 114 is shown to be homogeneous, in other embodiments the thyristor pillar material may comprise multiple discrete compositions.

The thyristor pillar material may be formed utilizing any suitable processing. For example, material 114 may be formed by epitaxial growth from exposed upper surfaces of the semiconductor material of substrate 82 (for instance, epitaxial growth of silicon carbide from an exposed upper surface of a monocrystalline silicon substrate). As another example, material 114 may be formed by deposition of one or more appropriate compositions within openings 112. The deposition may comprise chemical vapor deposition (CVD), atomic layer deposition (ALD) and/or any other suitable deposition process. Material 114 may be in situ doped during the formation of the material within the openings, and/or may be doped with one or more suitable implants occurring after formation of the material within the openings. If material 114 is formed within the openings with a deposition process and is amorphous as-deposited, and it is desired for material 114 to be crystalline (such as, for example when material 114 comprises, consists essentially of, or consists of one or more forms of silicon carbide), the material may be recrystallized after the deposition of the material within the openings. In some embodiments, such recrystallization may be accomplished with suitable thermal processing.

The formation of material 114 within the openings 112 patterns material 114 into a plurality of pillars 88. In some embodiments, material 114 may be deposited to overfill the openings, and to extend across an upper surface of dielectric material 110. Subsequently, chemical-mechanical polishing (CMP) or other planarization may be utilized to remove material 114 from over the upper surface of dielectric 110 and to form the illustrated structure of FIG. 21 having a plurality of spaced-apart pillars 88.

Figure 22:
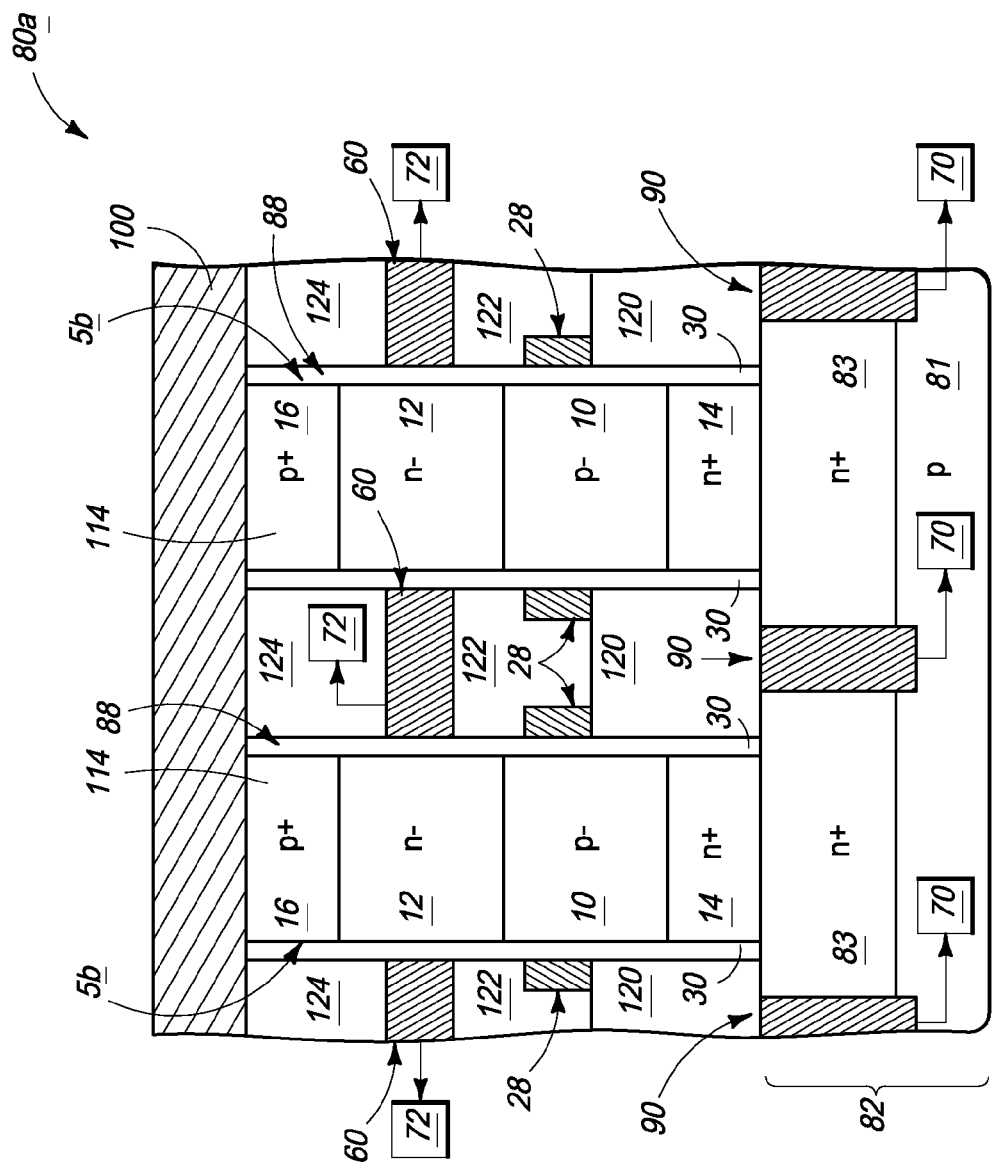

Referring to FIG. 22, the thyristor material 114 is shown after appropriate doping to form the electrode regions 14 and 16, and the base regions 10 and 12; and to thereby form appropriately-doped thyristor pillars from the thyristor material of the pillars 88. Such thyristor pillars may be incorporated into any of the various memory cells discussed above with reference to FIGS. 1, 2 and 11-13. In the shown embodiment, the thyristor pillars are incorporated into memory cells 5b analogous to those discussed above with reference to FIG. 11. Accordingly, dielectric material 30 is formed along sidewalls of the pillars 88, and gates 28 and 60 are formed along the base regions 10 and 12. The illustrated embodiment may be a memory array analogous to the array 50d of FIG. 14; and thus may have the interconnect regions 90 connected to common voltage of the type shown in FIG. 14 as nodes 70, and the gates 60 connected to common voltage of the type shown in FIG. 14 as nodes 72.

The dielectric material 30 may be formed utilizing processing of the type discussed above with reference to FIG. 19.

The gate 28 and 60 may be formed with any suitable processing. In some embodiments, dielectric material 110 (FIG. 21) may be removed to form spaces between the pillars 88 and to thereby expose sidewall surfaces of the pillars for formation of dielectric material 30. Subsequently, a dielectric material 120 may be formed over substrate 82 and between the pillars 88, and then gates 28 may be formed and patterned over such dielectric material. Another dielectric material 122 may be formed over and between the gates 28, and then gates 60 may be formed and patterned over the material 122. Subsequently, a dielectric material 124 may be formed over gates 60, and then bitline 100 may be formed and patterned over the dielectric material 124.

The dielectric materials (i.e., electrically insulative materials) 120, 122 and 124 may comprise any suitable compositions or combinations of compositions, including for example, one or more of silicon dioxide, silicon nitride, and any of various doped oxide glasses (for instance, borophosphosilicate glass, phosphosilicate glass, fluorosilicate glass, etc.). The electrically insulative materials 120, 122 and 124 may be the same composition as one another in some embodiments. Alternatively, at least one of such electrically insulative materials may differ in composition from at least one of the other of such electrically insulative materials in other embodiments.

In some embodiments, the base regions 10 and 12 may not be doped to the shown n and p types at the processing stage of FIG. 22, but instead such dopant types within the base regions may be electrically induced during utilization of the thyristors as discussed above with reference to FIG. 13.

Although FIGS. 20-22 pertain to formation of memory cells 5b of the type shown in FIG. 11, persons of ordinary skill will recognize that similar processing may be utilized to form any of the other memory cells described in this disclosure.

The embodiment of FIGS. 20-22 is a process in which gates 28 and 60 are formed after formation of thyristor material 114 (FIG. 21) within substantially vertical openings in a dielectric material. In other embodiments, the gates may first be formed within the dielectric material, and then the openings patterned through the material and filled with thyristor material 114. An example embodiment in which the gates are formed prior to filling openings with thyristor material is described with reference to FIGS. 23 and 24.

Figure 23:
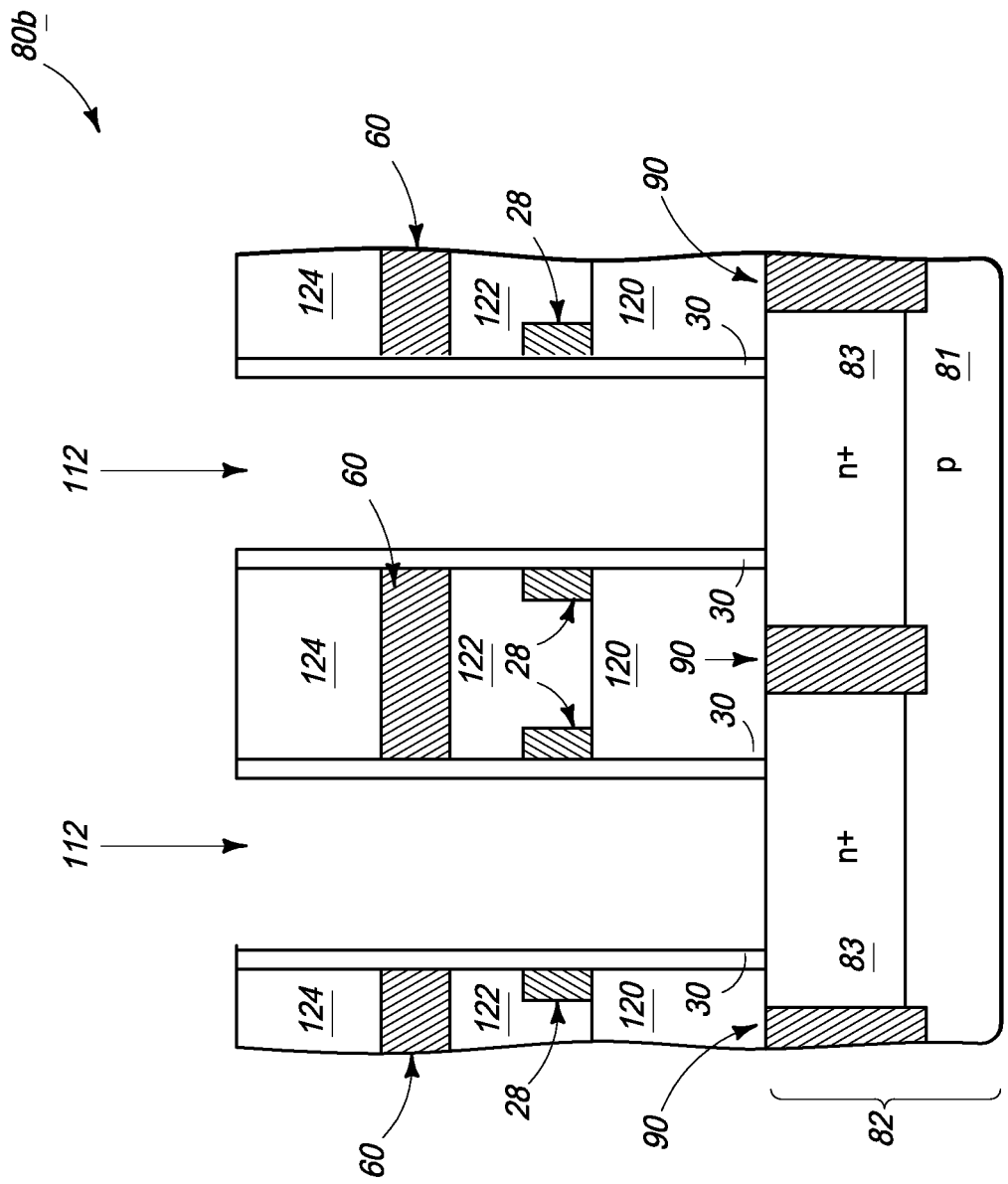
FIGS. 23 and 24 diagrammatically illustrate process stages of another example embodiment method for fabricating an array of memory cells.

Referring to FIG. 23, a semiconductor construction 80b is shown to comprise dielectric materials 120, 122 and 124, and the gates 28 and 60 supported over the dielectric materials 120 and 122. Openings 112 are formed through the dielectric materials, and adjacent the gates 28 and 60. The openings may be formed utilizing any appropriate mask (not shown) to define the locations of the openings, followed by one or more appropriate etches through the various materials to extend the openings to the upper surface of substrate 82.

The openings 112 are lined with the dielectric material 30. The dielectric material 30 may be formed in the shown configuration by initially depositing the dielectric material 30 to extend along sidewalls of the openings, across the bottom surfaces of the openings, and across top surfaces of dielectric material 124; and then utilizing an anisotropic etch to remove material 30 from along the horizontal surfaces, while leaving material along the vertical sidewall surfaces.

Figure 24:
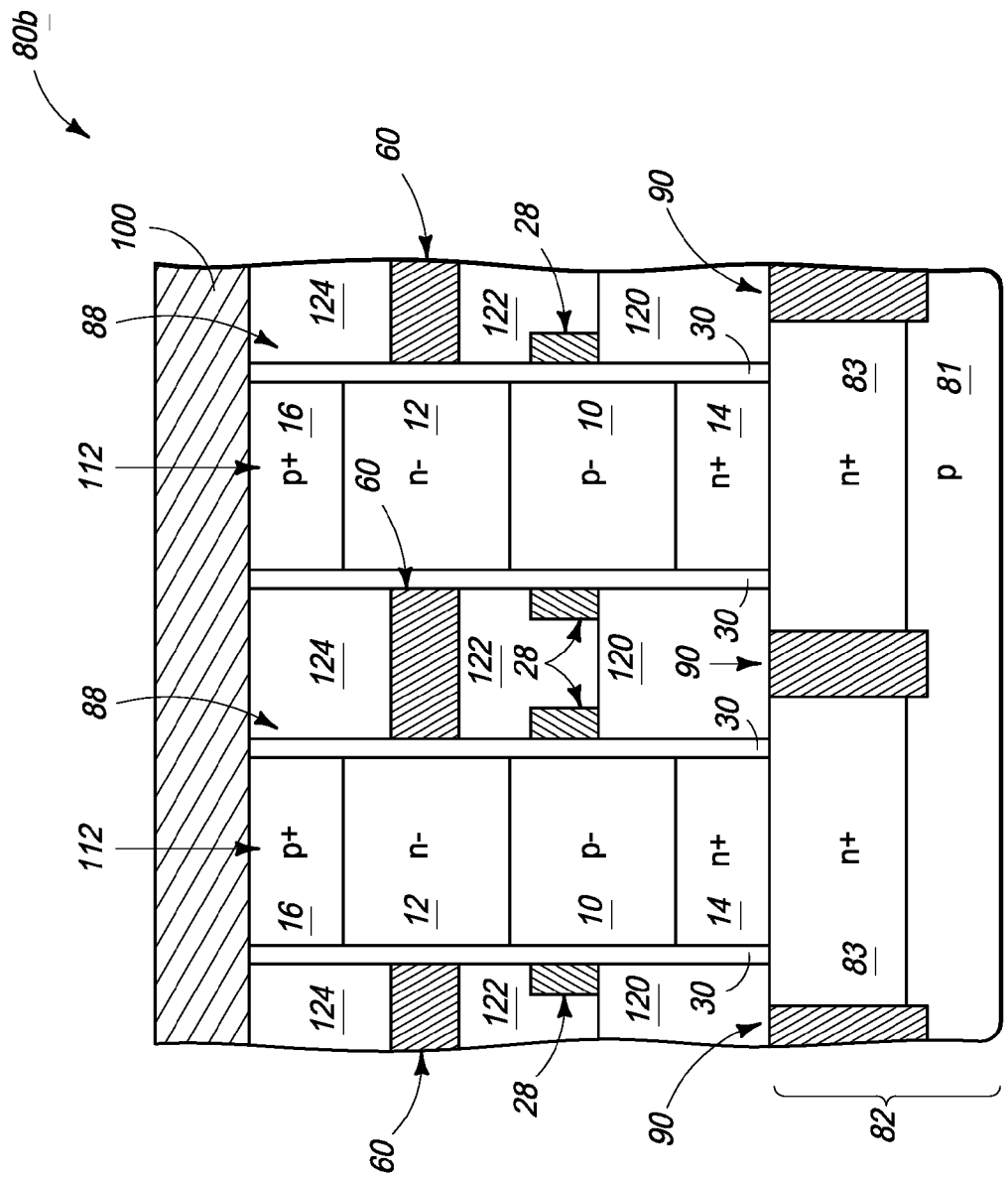

Referring to FIG. 24, thyristor material 114 is formed within openings 112 to form pillars 88. The thyristor material is appropriately doped to create electrode regions 14 and 16, and to create base regions 10 and 12. Subsequently, bitline 100 may be formed across the pillars 88.

The embodiment of FIGS. 20-22 formed all of the thyristor material 114 (FIG. 21) of the vertical pillars 88 (FIG. 22) within the openings 112 in the patterned material 110 (FIG. 20). In other embodiments, only some of the thyristor material of such pillars may be formed within openings in a patterned material. An example embodiment in which only some of the thyristor material is formed within openings in a patterned material is described with reference to FIGS. 25-28.

Figure 25:
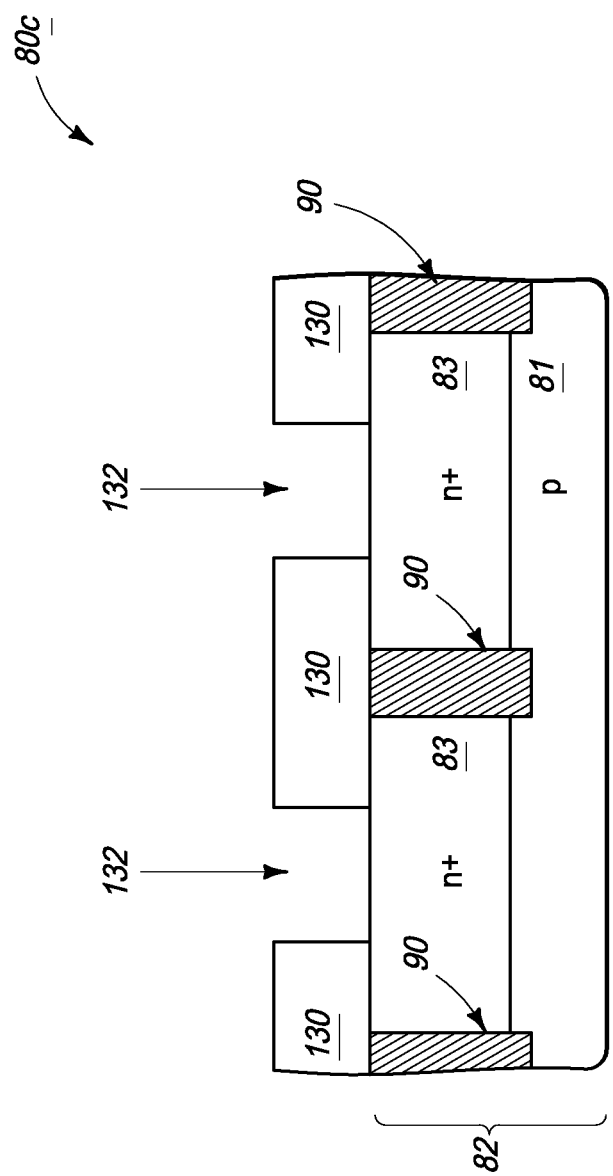
FIGS. 25-28 diagrammatically illustrate process stages of another example embodiment method for fabricating an array of memory cells.

Referring to FIG. 25, a construction 80c comprises the substrate 82 and a patterned material 130 formed over the substrate. The material 130 may comprise any suitable composition or combination of compositions, and in some embodiments may be electrically insulative and may comprise, consist essentially of, or consist of one or more of silicon dioxide, silicon nitride, and any of various doped silicon oxide glasses (for instance, borophosphosilicate glass, phosphosilicate glass, etc.). The patterned material 130 has a plurality of openings 132 extending therethrough, with such openings being arranged in a pattern across the substrate. The openings may be formed utilizing any suitable processing, such as, for example, formation of a patterned mask (not shown) over the dielectric material 130 to define locations for the openings, followed by one or more suitable etches through material 130 to create the openings. The patterned mask may be any suitable mask, including, for example, a photolithographically-patterned photoresist mask, and/or a mask created utilizing various pitch multiplication methodologies.

Figure 26:
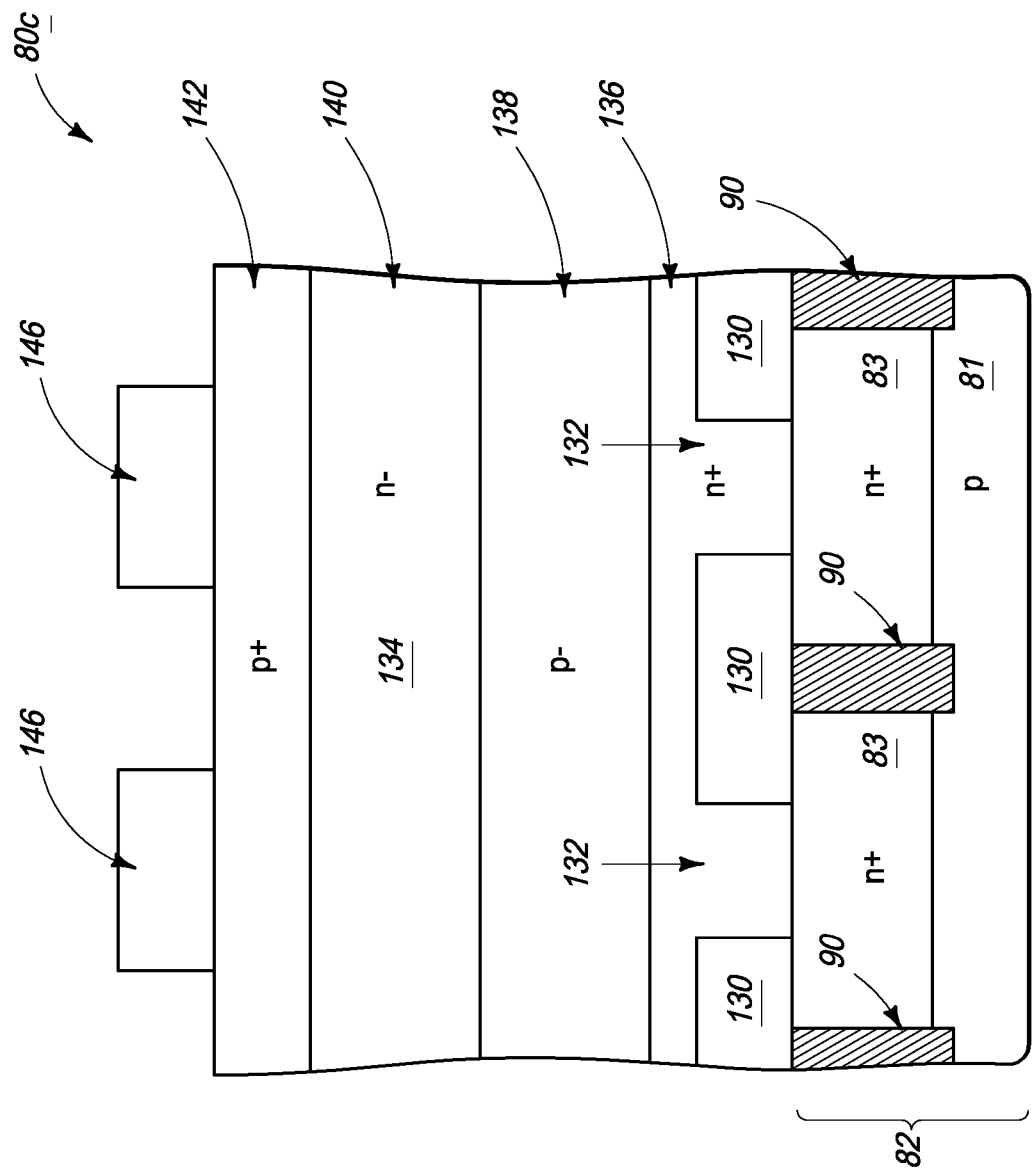

Referring to FIG. 26, a material 134 is formed within openings 132. The material 134 overfills the openings, and thus forms an expanse extending across the upper surface of patterned material 130. The material 134 may comprise wide-bandgap material, such as, for example, one or more forms of silicon carbide (with an example form of silicon carbide being 3C-SiC), and may be epitaxially grown from exposed surfaces of substrate 82 within the openings (for instance, the material 134 may comprise one or more forms of silicon carbide epitaxially grown from exposed surfaces of monocrystalline silicon of substrate 82). The material 134 is shown to be in situ doped to form alternating n-type and p-type regions 136, 138, 140 and 142.

Epitaxially-grown material formed within openings (such as, for example, the openings 132) may have stacking faults therein. However, if the bulk of the epitaxially-grown material is outside of the openings, the epitaxially-grown material within the openings and directly above the openings may be relatively clean of stacking faults, and instead the stacking faults may be primarily within regions between the openings (which are regions which will ultimately be removed to form pillars 88 in processing described below with reference to FIG. 27).

A patterned mask is formed over material 134, with such mask comprising the shown features 146. The patterned mask may be any suitable mask, including, for example, a photolithographically-patterned photoresist mask, and/or a mask created utilizing various pitch multiplication methodologies.

Figure 27:
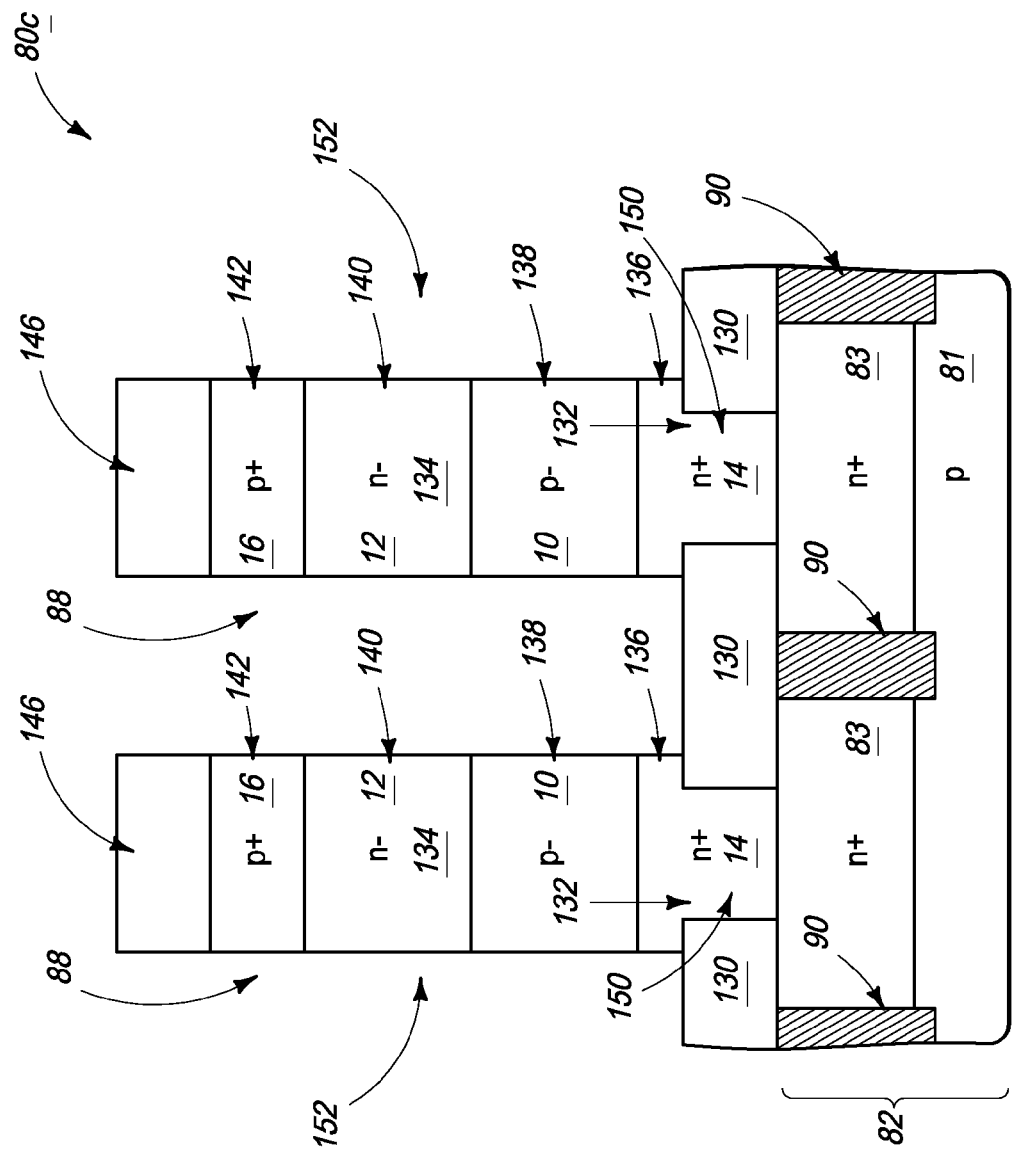

Referring to FIG. 27, a pattern is transferred from masking features 146 into material 134 with one or more suitable etches to pattern the material 134 into pillars 88. The doped regions 136, 138, 140 and 142 of material 134 become the various electrode and base regions 10, 12, 14 and 16 of the thyristor pillars.

The illustrated thyristor pillars have narrower segments 150 within the openings 132 in material 130, and have wider segments 152 over the narrower segments (with the terms "narrower" and "wider" being relative to one another, and indicating the segments 150 are narrow relative to the segments 152).

Figure 28:
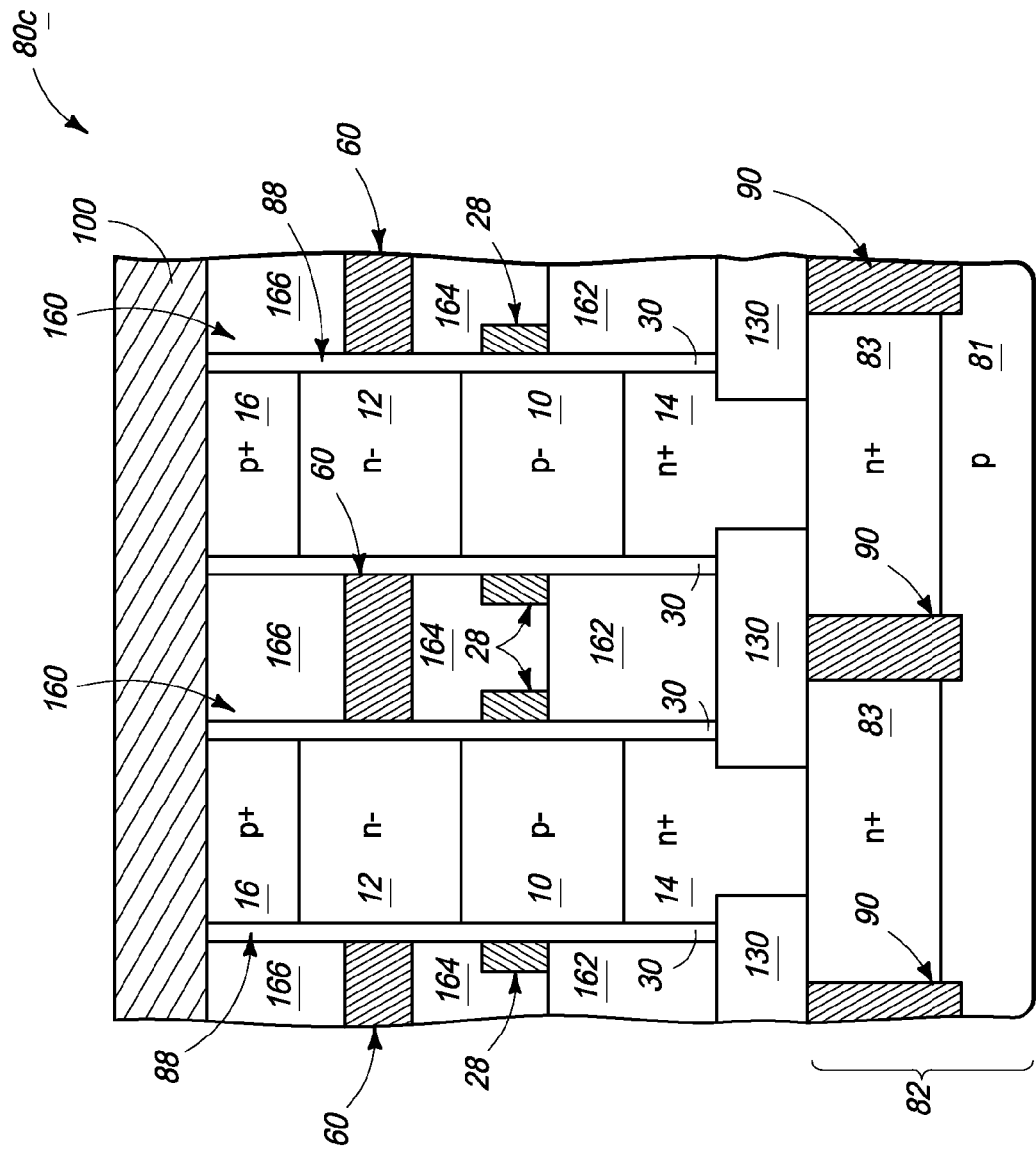

Referring to FIG. 28, masking material features 146 (FIG. 27) are removed, and the thyristor pillars 88 are incorporated into memory cells 160. In the shown embodiment, dielectric material 162 is formed over the dielectric material 130, and subsequently gates 28 are formed over the dielectric material 162. A dielectric material 164 is formed over and between the gates 28, and then gates 60 are formed over the material 164. Dielectric material 166 is then formed over the gates 60, and the bitline 100 is formed and patterned over the dielectric material 166.

Another example embodiment in which only some of the thyristor material is formed within openings in a patterned material is described with reference to FIGS. 29-31.

Figure 29:
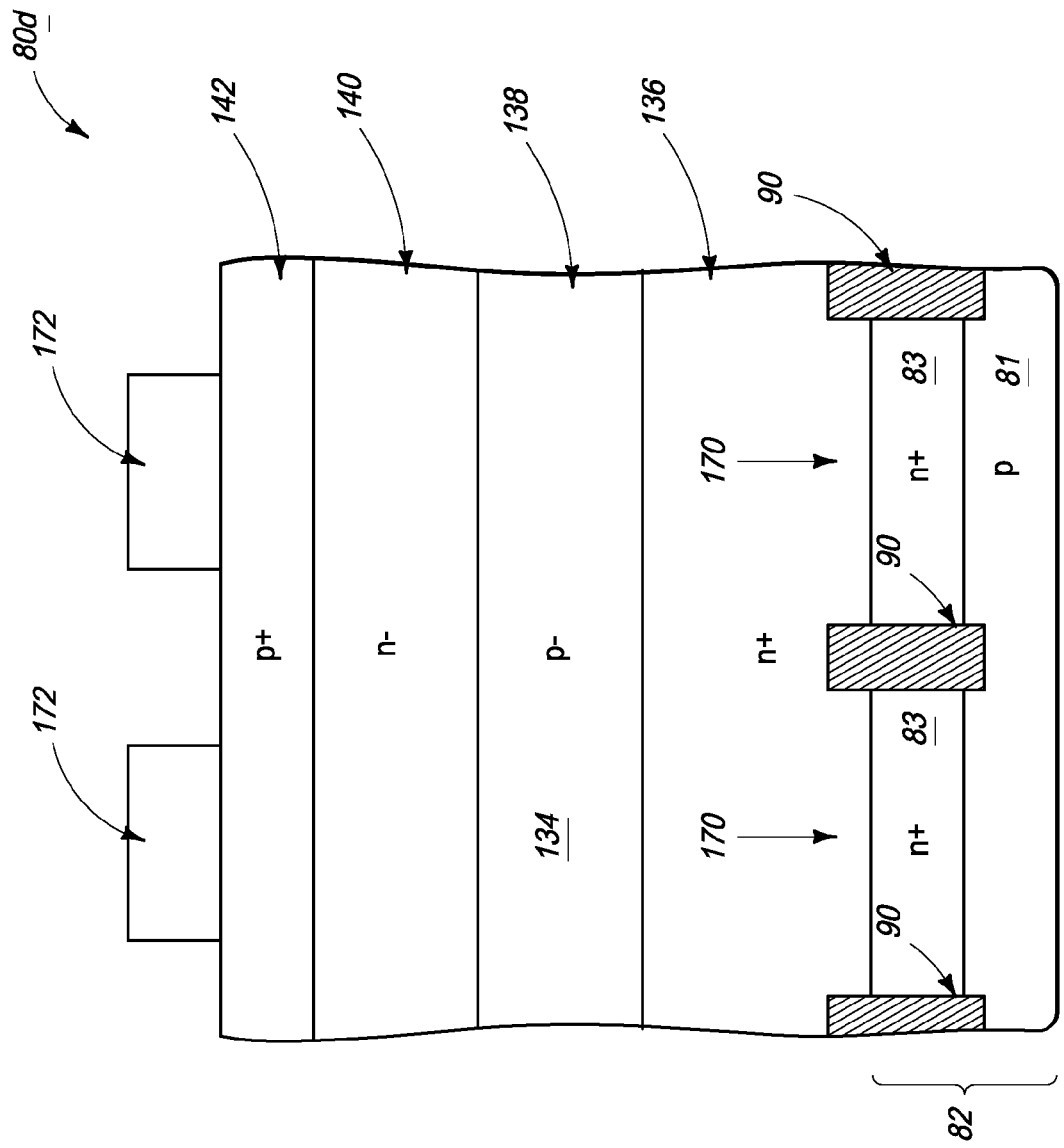
FIGS. 29-31 diagrammatically illustrate process stages of another example embodiment method for fabricating an array of memory cells.

Referring to FIG. 29, a construction 80d comprises the substrate 82, and comprises the conductive interconnects 90 formed to extend above an upper surface of the substrate. The shown interconnects 90 may be considered to correspond to patterned features of a mask, and to define a pattern of openings 170 extending between the interconnects and to the upper surface of the substrate.

The material 134 is formed within openings 170 and across upper surfaces of interconnects 90. The material 134 may comprise the wide-bandgap material discussed above with reference to FIG. 26, and may be epitaxially grown from exposed surfaces of substrate 82. The material 134 is in situ doped to form the alternating n-type and p-type regions 136, 138, 140 and 142.

A patterned mask is formed over material 134, with such mask comprising the shown features 172. The patterned mask may be any suitable mask, including, for example, a photolithographically-patterned photoresist mask, and/or a mask created utilizing various pitch multiplication methodologies.

Figure 30:
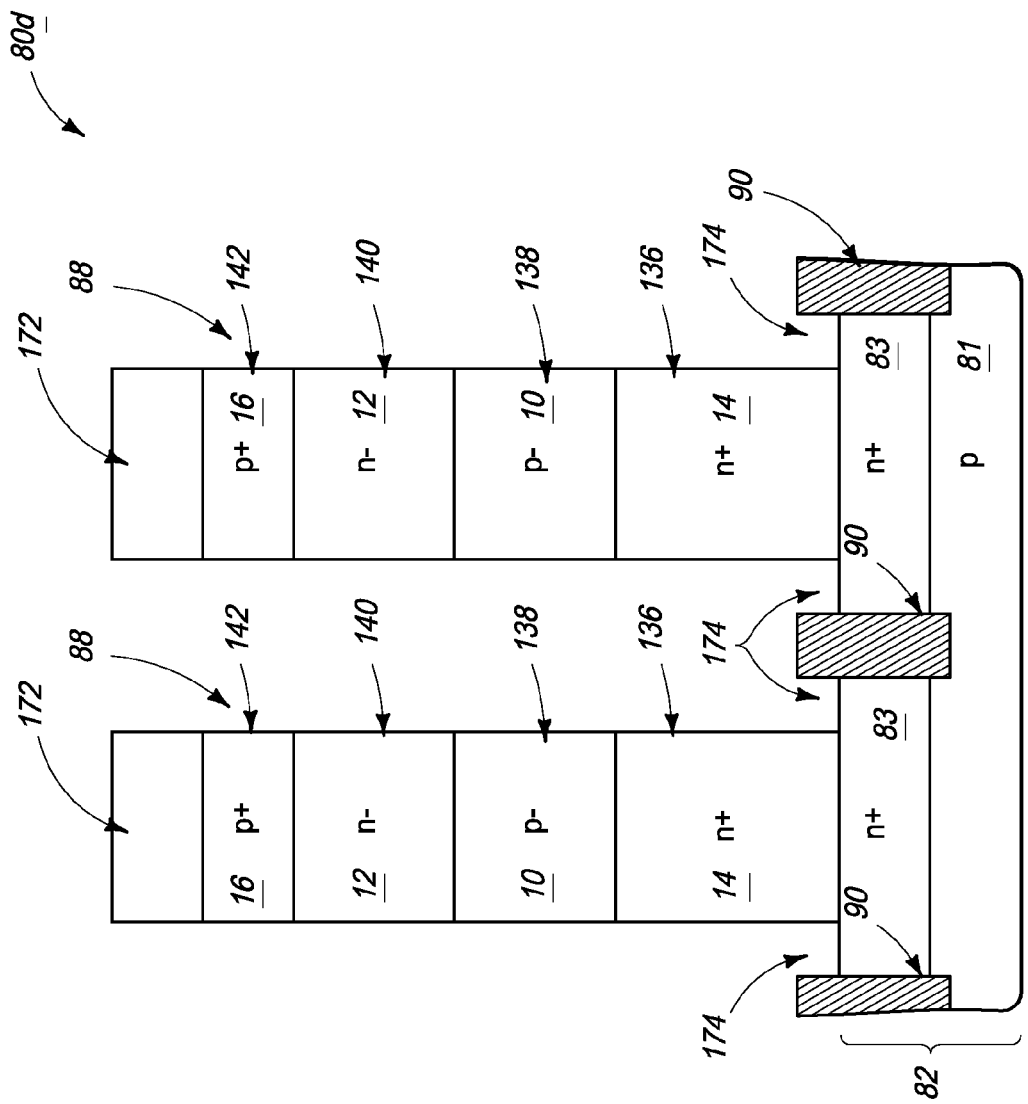

Referring to FIG. 30, a pattern is transferred from masking features 172 into material 134 with one or more suitable etches to pattern the material 134 into pillars 88. The doped regions 136, 138, 140 and 142 of material 134 become the various electrode and base regions 10, 12, 14 and 16 of the thyristor pillars.

The patterning of the thyristor pillars forms gaps 174 which space the thyristor pillars from the upper portions of interconnects 90.

Figure 31:
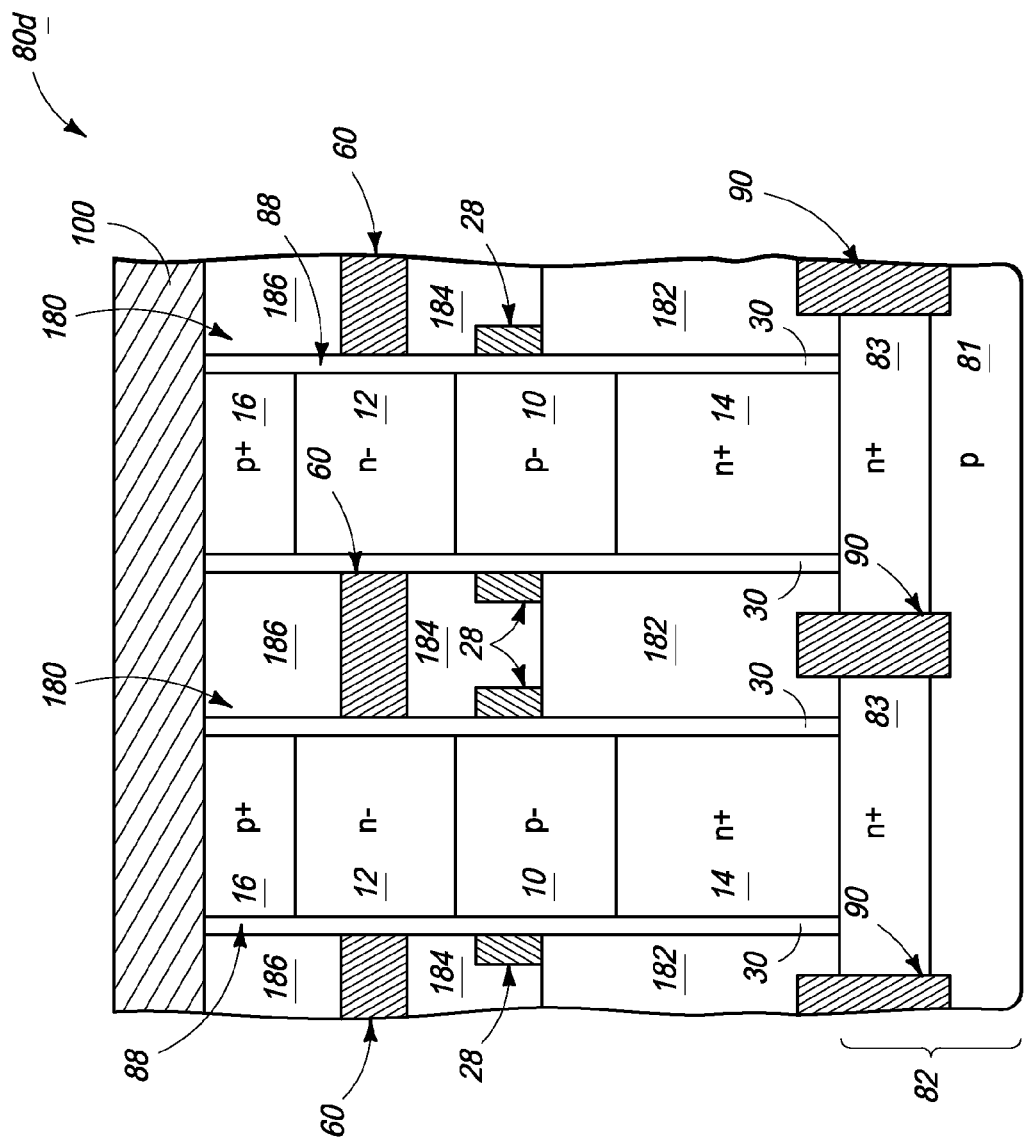

Referring to FIG. 31, masking material features 172 (FIG. 30) are removed, and the thyristor pillars 88 are incorporated into memory cells 180. In the shown embodiment, dielectric material 182 is formed over the substrate 82, and subsequently gates 28 are formed over the dielectric material 182. A dielectric material 184 is formed over and between the gates 28, and then gates 60 are formed over the material 184. Dielectric material 186 is then formed over the gates 60, and the bitline 100 is formed and patterned over the dielectric material 186.

The various memory cells and arrays discussed above may be incorporated into integrated circuit chips or packages, and such may utilized in electronic devices and/or electronic systems. The electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of programming a thyristor, comprising:
providing the thyristor to comprise a structure containing two electrode regions and a segment between the electrode regions, at least one section of the segment being proximate a gate and thus being a gated portion of the segment;
inducing a conductivity type within the gated portion of the segment with an electrical field formed with the gate to form four regions of alternating p-type and n-type conductivity within the structure; two of the four regions being the electrode regions, and the other two of the four regions being base regions the electrode regions being a first electrode region and a second electrode region; the base regions being a first base region and a second base region; the first base region being between the first electrode region and the second base region; the second base region being between the second electrode region and the first base region; and utilizing a voltage differential between the two electrode regions, together with capacitive coupling from the gate, to induce a memory state within the thyristor.

2. The method of claim 1 wherein at least the gated portion comprises a material having a bandgap of at least 1.2 eV.

3. The method of claim 2 wherein the material has a bandgap of at least 2.3 eV.

4. The method of claim 1 wherein:

the thyristor comprises two gated portions of the segment; and n-type conductivity is induced within one of the two gated portions to form an n-type base region while p-type conductivity is induced within the other of the two gated portions to form a p-type base region adjacent the n-type base region.

5. The method of claim 4 wherein both of the two gated portions are capacitively coupled to their respective gates during the inducement of the memory state.

6. The method of claim 4 wherein only one of the two gated portions is capacitively coupled to its gate during the inducement of the memory state.

7. The method of claim 4 wherein at least the two gated portions of the structure comprise material having a bandgap of at least 1.2 eV.

* * * * *